US008248833B2

(12) United States Patent
Koyama et al.

(10) Patent No.: US 8,248,833 B2
(45) Date of Patent: Aug. 21, 2012

(54) SEMICONDUCTOR MEMORY DEVICE AND SEMICONDUCTOR DEVICE

(75) Inventors: Jun Koyama, Kanagawa (JP); Atsushi Miyaguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/552,749

(22) Filed: Sep. 2, 2009

(65) Prior Publication Data

US 2010/0061136 A1 Mar. 11, 2010

(30) Foreign Application Priority Data

Sep. 5, 2008 (JP) ................. 2008-227769

(51) Int. Cl.
*G11C 5/06* (2006.01)
*G11C 5/08* (2006.01)
(52) U.S. Cl. ........................... 365/63; 365/69
(58) Field of Classification Search .......... None
See application file for complete search history.

(56) References Cited

U.S. PATENT DOCUMENTS

| 6,051,851 | A | 4/2000 | Ohmi et al. | |
|---|---|---|---|---|
| 6,534,841 | B1 | 3/2003 | Van Brocklin et al. | |
| 7,190,602 | B2* | 3/2007 | Johnson et al. ........... | 365/63 |
| 7,224,013 | B2 | 5/2007 | Herner et al. | |
| 7,405,465 | B2 | 7/2008 | Herner | |
| 7,410,838 | B2* | 8/2008 | Ang ..................... | 438/131 |
| 2004/0207051 | A1* | 10/2004 | Takizawa ................ | 257/658 |
| 2006/0067117 | A1* | 3/2006 | Petti .................... | 365/175 |
| 2006/0073657 | A1 | 4/2006 | Herner et al. | |
| 2006/0087005 | A1 | 4/2006 | Herner | |
| 2006/0273182 | A1 | 12/2006 | Iwata | |
| 2008/0002454 | A1 | 1/2008 | Inoue et al. | |
| 2008/0025118 | A1* | 1/2008 | Scheuerlein ............. | 365/201 |
| 2008/0083830 | A1 | 4/2008 | Tokunaga et al. | |
| 2008/0144374 | A1 | 6/2008 | Kato | |
| 2009/0026582 | A1 | 1/2009 | Herner | |

FOREIGN PATENT DOCUMENTS

| EP | 1 320 132 A2 | 6/2003 |
|---|---|---|
| JP | 61-230360 | 10/1986 |
| JP | 7-297293 | 11/1995 |
| JP | 2007-12035 | 1/2007 |
| JP | 2007-318104 | 12/2007 |
| WO | WO 2007/067448 A1 | 6/2007 |

OTHER PUBLICATIONS

International Search Report re application No. PCT/JP2009/064369, dated Nov. 17, 2009.
Written Opinion re application No. PCT/JP2009/064369, dated Nov. 17, 2009.

* cited by examiner

*Primary Examiner* — Hoai V Ho
*Assistant Examiner* — Min Huang
(74) *Attorney, Agent, or Firm* — Husch Blackwell LLP

(57) ABSTRACT

An anti-fuse memory device includes a plurality of word lines, a plurality of bit lines, and a memory cell provided with respect to an intersecting portion of any of the plurality of word lines and any of the plurality of bit lines. Memory cell includes a PIN diode and an anti-fuse. An anode of the PIN diode is electrically connected to any of the bit lines. A cathode of the PIN diode is electrically connected to a first terminal of the anti-fuse. A second terminal of the anti-fuse is electrically connected to any of the word lines. The anti-fuse includes a silicon layer and an insulating layer which are interposed between electrodes.

12 Claims, 17 Drawing Sheets

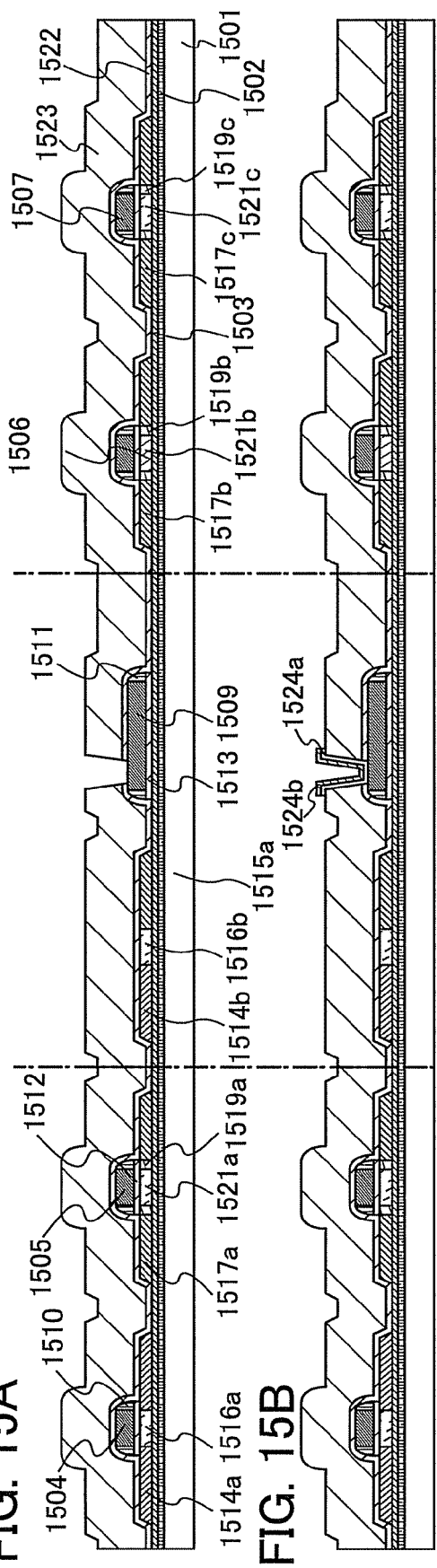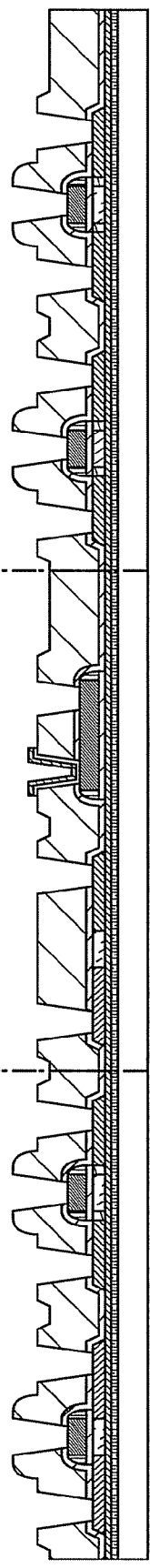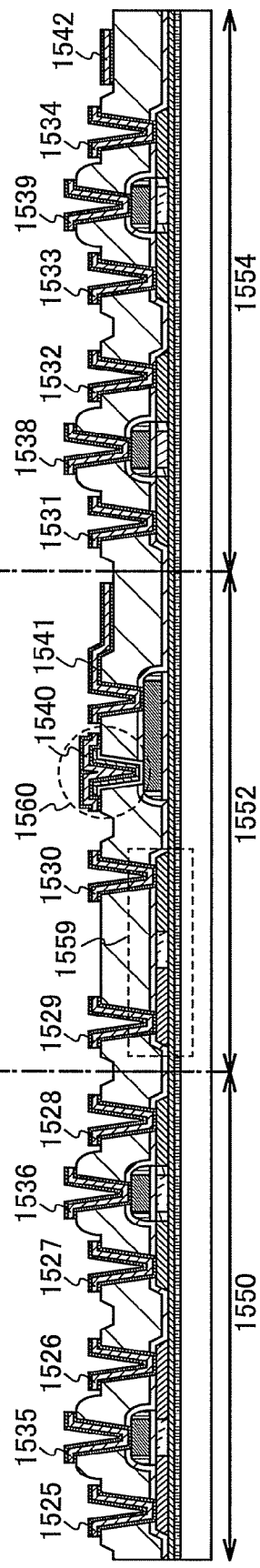

1700

1700

1700

1700

1700

1700

120
SEMICONDUCTOR MEMORY DEVICE AND SEMICONDUCTOR DEVICE

TECHNICAL FIELD

The present invention relates to a semiconductor memory device and a semiconductor device. In specific, the present invention relates to an anti-fuse semiconductor memory device and a semiconductor device each of which is provided with an anti-fuse semiconductor memory element.

Note that in this specification, a semiconductor device refers to a device which can function by utilizing semiconductor properties. It is to be noted that a semiconductor memory device in this specification indicates a memory device which can function by utilizing semiconductor properties.

BACKGROUND ART

Technological development of devices which temporarily (a volatile memory) or semi-permanently (a non-volatile memory) store data by application of electrical or physical action on memory devices (also referred to as memories) provided in electronic devices has been active. In recent years, design of new memory devices aimed at price-reduction by improving function, miniaturization, or the like has also been actively developed. Note that a volatile memory refers to a memory device in which data is lost even after the data is held. In addition, a nonvolatile memory refers to a memory device in which data can be held semi-permanently after the data is held.

Among non-volatile memories, a ROM (read only memory), which performs only reading, is classified into a mask ROM and a PROM (programmable ROM). An EEPROM (electrically erasable and programmable read only memory), a fuse ROM, and an anti-fuse ROM belong to PROMs.

The mask ROM is a ROM to which information is written using a photomask or a laser direct drawing apparatus in a manufacturing process. The fuse ROM is a ROM in which a fuse which is in a conductive state at the time of manufacture is used for a memory element and the fuse is disconnected by current after the manufacture to make electrodes of the fuse electrically disconnected, whereby information is stored (hereinafter the fuse ROM is referred to as a fuse memory device). On the other hand, the anti-fuse ROM is a ROM in which an anti-fuse which is in a nonconductive state at the time of manufacture is used for a memory element and electrodes of the anti-fuse are electrically connected by current after the manufacture, whereby information is written thereto (hereinafter the anti-fuse ROM is referred to as an anti-fuse memory device). For example, Patent Document 1 discloses an anti-fuse memory device in which an anti-fuse memory element is electrically connected to a PN junction diode in series.

[Patent Document 1]
Japanese Published Patent Application No. 2007-318104

DISCLOSURE OF INVENTION

According to one embodiment of the present invention, an object is to provide an anti-fuse semiconductor memory device in which malfunction of writing or reading data to/from a memory device is suppressed and/or a memory element is more highly integrated.

One embodiment of the present invention is a semiconductor memory device which includes memory cells arranged in matrix and each provided at an intersecting portion of a word line and a bit line. The memory cell includes a PIN diode and an anti-fuse. An anode of the PIN diode is electrically connected to the bit line. A cathode of the PIN diode is electrically connected to a first terminal of the anti-fuse. A second terminal of the anti-fuse is electrically connected to the word line. The anti-fuse includes a silicon layer and an insulating layer which are interposed between electrodes.

One embodiment of the present invention is a semiconductor memory device which includes memory cells arranged in matrix and each provided at an intersecting portion of a word line and a bit line. The memory cell includes a PIN diode and an anti-fuse. A first terminal of the anti-fuse is electrically connected to the bit line. A second terminal of the anti-fuse is electrically connected to an anode of the PIN diode. A cathode of the PIN diode is electrically connected to the word line. The anti-fuse includes a silicon layer and an insulating layer which are interposed between electrodes.

One embodiment of the present invention is a semiconductor memory device which includes memory cells arranged in matrix and each provided at an intersecting portion of a word line and a bit line. The memory cell includes a PIN diode and an anti-fuse. An anode of the PIN diode is electrically connected to the bit line. A cathode of the PIN diode is electrically connected to a first terminal of the anti-fuse. A second terminal of the anti-fuse is electrically connected to the word line. The anti-fuse includes a silicon layer and an insulating layer which are interposed between electrodes. A p-type semiconductor region, an intrinsic semiconductor region, and an n-type semiconductor region of the PIN diode are provided so as to overlap with each other.

One embodiment of the present invention is a semiconductor memory device which includes memory cells arranged in matrix and each provided at an intersecting portion of a word line and a bit line. The memory cell includes a PIN diode and an anti-fuse. A first terminal of the anti-fuse is electrically connected to the bit line. A second terminal of the anti-fuse is electrically connected to an anode of the PIN diode. A cathode of the PIN diode is electrically connected to the word line. The anti-fuse includes a silicon layer and an insulating layer which are interposed between electrodes. A p-type semiconductor region, an intrinsic semiconductor region, and an n-type semiconductor region of the PIN diode are provided so as to overlap with each other.

One embodiment of the present invention is a semiconductor memory device which includes memory cells arranged in matrix and each provided at an intersecting portion of a word line and a bit line. The memory cell includes a PIN diode and an anti-fuse. An anode of the PIN diode is electrically connected to the bit line. A cathode of the PIN diode is electrically connected to a first terminal of the anti-fuse. A second terminal of the anti-fuse is electrically connected to the word line. The anti-fuse includes a silicon layer and an insulating layer which are interposed between electrodes. A p-type semiconductor region, an intrinsic semiconductor region, and an n-type semiconductor region of the PIN diode are provided so as to align with each other.

One embodiment of the present invention is a semiconductor memory device which includes memory cells arranged in matrix and each provided at an intersecting portion of a word line and a bit line. The memory cell includes a PIN diode and an anti-fuse. A first terminal of the anti-fuse is electrically connected to the bit line. A second terminal of the anti-fuse is electrically connected to an anode of the PIN diode. A cathode of the PIN diode is electrically connected to the word line. The anti-fuse includes a silicon layer and an insulating layer which are interposed between electrodes. A p-type semiconductor region, an intrinsic semiconductor region, and an n-type semiconductor region of the PIN diode are provided so as to align with each other.

According to one embodiment of the present invention, an anti-fuse memory device which has few malfunctions in data writing and data reading to/from a memory device and/or can achieve higher integration of a memory element can be provided.

BRIEF DESCRIPTION OF DRAWINGS

FIGS. 15A to 15D are diagrams for describing Embodiment 6.

DETAILED DESCRIPTION OF THE INVENTION

Embodiments of the present invention will be explained with reference to the drawings. However, the present invention is not limited to the following description, and various changes for the modes and details thereof will be apparent to those skilled in the art unless such changes depart from the spirit and scope of the invention. Therefore, the present invention should not be interpreted as being limited to the description of the embodiments to be given below.

Embodiment 1

In this embodiment, a semiconductor memory device according to one embodiment of the present invention will be described.

Figure 1A:
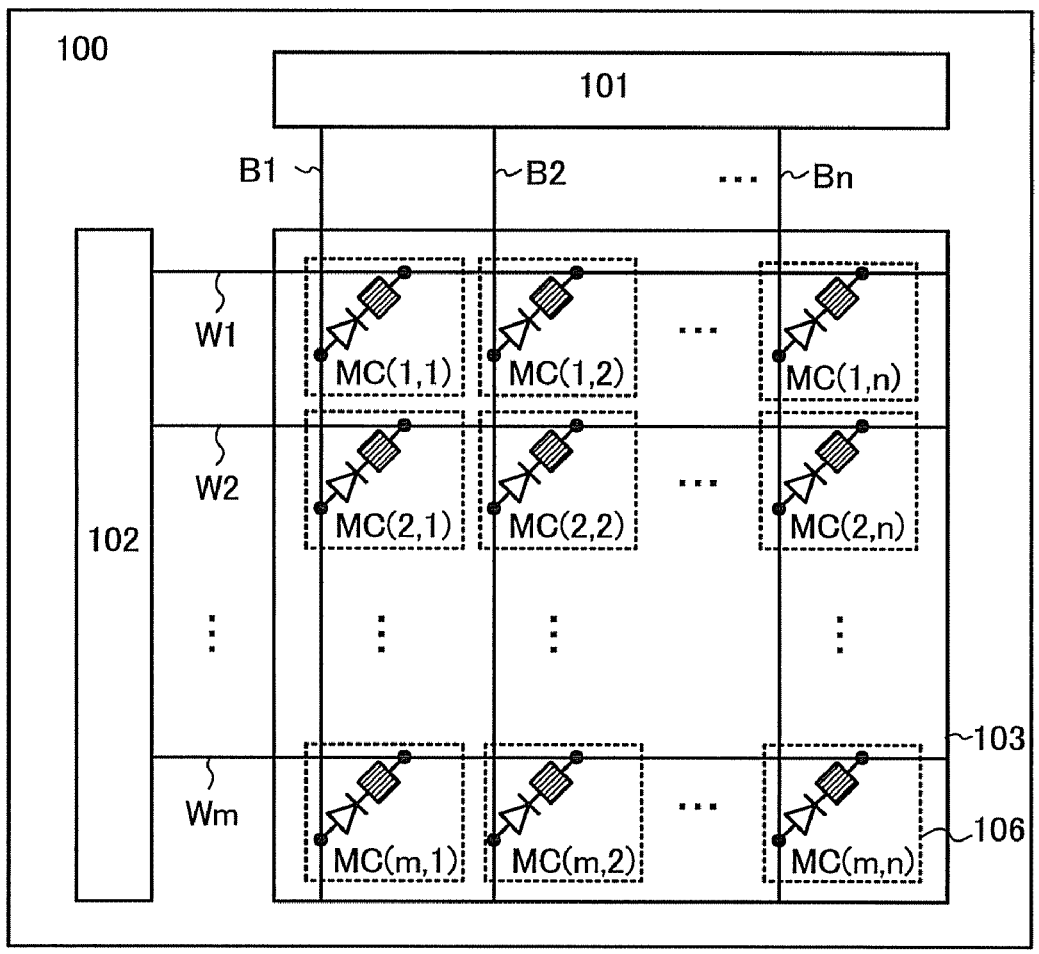
FIGS. 1A and 1B are diagrams for describing Embodiment 1.
Figure 1B:
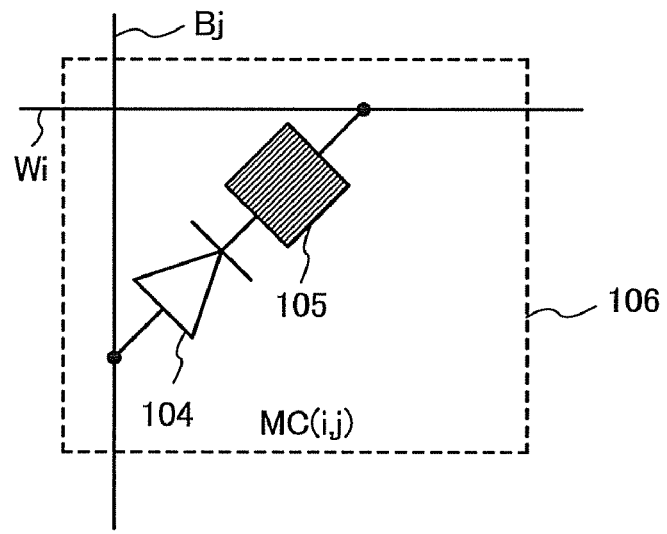

FIG. 1A shows an example of a structure of a memory cell array and a peripheral driver circuit included in the semiconductor memory device. Further, FIG. 1B shows a circuit diagram of a memory cell included in the memory cell array. Furthermore, FIG. 2 shows an example of a structure of the semiconductor memory device.

A semiconductor memory device 100 includes a bit line driver circuit 101, a word line driver circuit 102, and a memory cell array 103. FIG. 1A illustrates an example of the memory cell array 103 in which (m×n) memory cells 106 ((MC (1, 1) to MC(m, n)) are arranged in matrix so as to align m memory cells in column and n memory cells in row. Note that the memory cell 106 is provided for every intersecting portion of a bit line and a word line. Note that the semiconductor memory device 100 includes a boosting circuit (not shown) which generates a voltage for wiring data in the memory cell and, with the bit line driver circuit 101 and the word line driver circuit 102, generates a plurality of voltage levels in each memory cell. Note that the boosting circuit may be formed using a charge pump circuit or the like.

In addition, as shown in FIG. 1B, each of the memory cells 106 (the memory cell MC(i, j) as a representative) (i is an integer greater than or equal to 1 and less than or equal to m and j is an integer greater than or equal to 1 and less than or equal to n) includes a PIN diode 104 and an anti-fuse 105. An anode side of the PIN diode 104 is electrically connected to a bit line Bj and a cathode side of the PIN diode 104 is electrically connected to a first terminal of the anti-fuse 105. Further, a second terminal of the anti-fuse 105 is electrically connected to a word line Wi.

Figure 2:
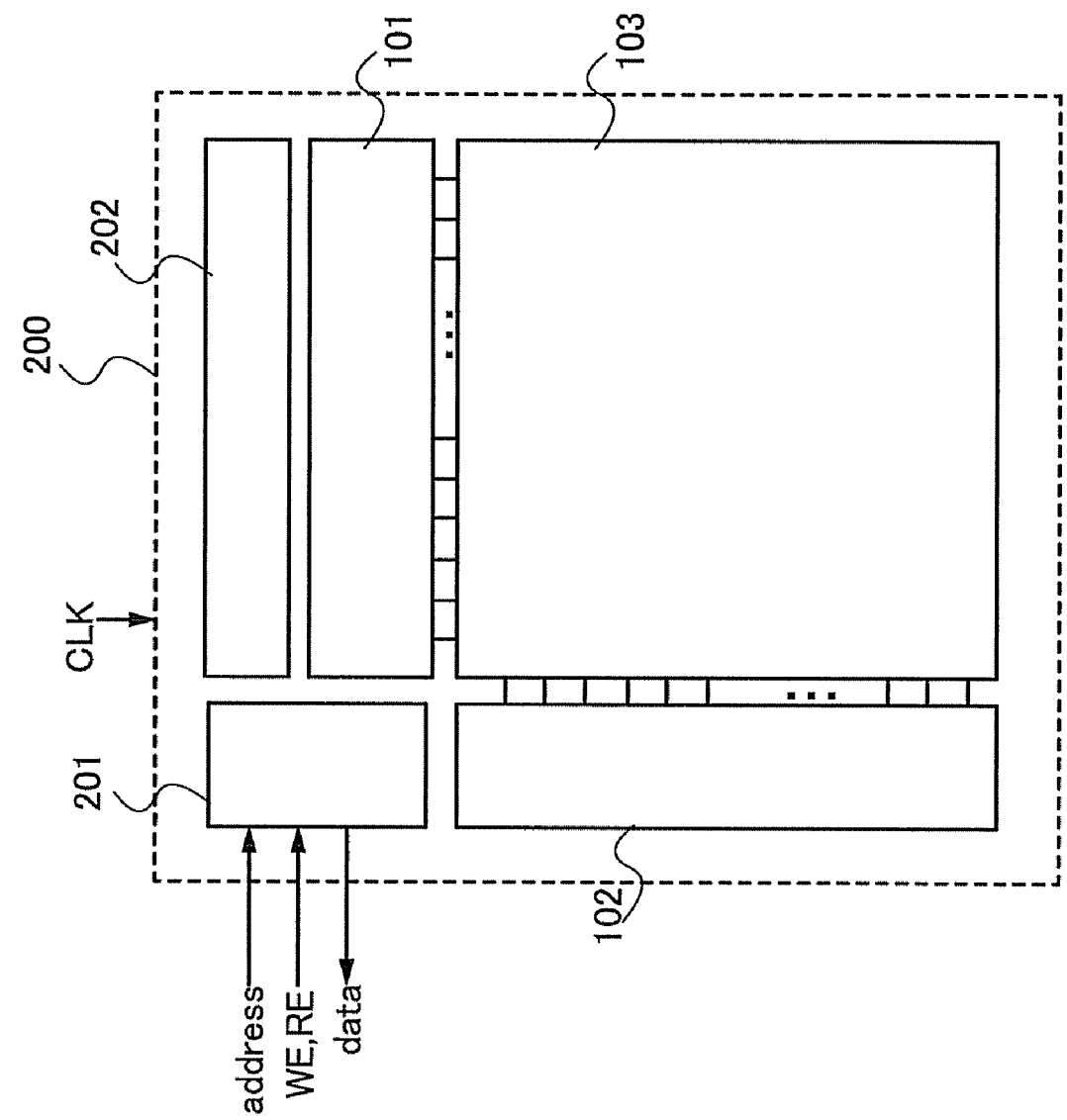
FIG. 2 is a diagram for describing Embodiment 1.

In addition, FIG. 2 shows each signal input and output as well as a block diagram of the semiconductor memory device described in FIG. 1A. FIG. 2 shows a semiconductor memory device 200 which includes an interface portion 201, a boosting circuit 202, the bit line driver circuit 101, the word line driver circuit 102, and the memory cell array 103. Data (address) related to an address of the memory cell array, a writing control signal (WE), and a reading control signal (RE) are input to the interface portion 201 from the outside of the semiconductor memory device 200 and the interface portion 201 outputs data (data) read out from the memory cell array 103. Further, the boosting circuit 202 includes a charge pump circuit inside and generates a voltage level required for writing data in the memory cell array 103. Furthermore, a clock signal (CLK) and a power supply voltage (Vdd and Vss) are input to the semiconductor memory device 200 and the semiconductor memory device 200 operates. Note that by using transistors, thin film transistors (TFTs) in particular, as a logic circuit, a switching element, and the like which are included in the interface portion 201, the boosting circuit 202, the bit line driver circuit 101, and the word line driver circuit 102, the logic circuit, the switching element, and the like can be formed at low cost as compared to the case of using a single crystal silicon substrate, which is advantageous.

Note that terms such as first, second, third to Nth (N is a natural number) seen in this specification are used in order to avoid confusion between components and do not set a limitation on number.

Note that in this specification, the state where A and B are connected to each other includes the state where A and B are electrically connected to each other as well as the state where A and B are directly connected to each other. Here, the state where A and B are electrically connected to each other includes the case where A and B are approximately the same node through an object which acts electrically and is provided between A and B.

In specific, the state where A and B are electrically connected to each other includes the cases where, considering operation of circuit, A and B may be regarded as the same node without any problem: A and B are connected to each other through a switching element such as a transistor so that A and B have approximately the same potential due to conduction of the switching element; and A and B are connected to each other through a resistor and a potential difference between the both ends of the resistor does not adversely affect the operation of the circuit including A and B.

Note that a semiconductor memory device is a memory device which can function by utilizing semiconductor properties. Note that the semiconductor memory device includes a memory cell array having a plurality of memory cells. Note that the semiconductor memory device may include a bit line driver circuit, a word line driver circuit, a boosting circuit, and an interface portion which are peripheral driver circuits for driving the plurality of memory cells. Note that the peripheral driver circuit for driving the plurality of memory cells may be formed over the same substrate as the plurality of memory cells.

Note that as a semiconductor layer of a TFT for forming a logic circuit and a switching element included in the interface portion 201, the boosting circuit 202, the bit line driver circuit 101, and the word line driver circuit 102, and as a semiconductor layer for forming a PIN diode included in the memory cell, a variety of kinds of semiconductor layers can be used. For example, a non-single crystalline semiconductor layer typified by amorphous silicon, polycrystalline silicon, microcrystalline (also referred to as micro crystal or semi-amorphous) silicon, or the like can be employed. In the case where an element is formed by using a thin film such as a semiconductor layer, a variety of advantages are obtained. For example, since TFTs can be formed at temperature lower than those using single crystalline silicon, the manufacturing cost can be reduced and a manufacturing apparatus can be made larger. Since the manufacturing apparatus can be made larger, the TFTs can be formed using a large substrate. Accordingly, a large number of semiconductor memory devices can be formed at the same time, and thus can be formed at low cost. In addition, because the manufacturing temperature is low, a substrate which has low heat resistance and is inexpensive can be used.

Note that in this specification, a PIN diode is described with a bit line side having a high potential (voltage) at the time of operation denoted as an anode and an anti-fuse side having a low potential (voltage) at the time of operation denoted as a cathode. In addition, an anti-fuse is described with a terminal on a side which is electrically connected to the cathode of the PIN diode denoted as a first terminal and with a terminal on a word line side denoted as a second terminal. Further, semiconductor regions of p-type, i-type, and n-type which form the PIN diode are referred to as a p-type semiconductor region, an intrinsic semiconductor region, and an n-type semiconductor region, respectively.

Note that in this specification, a transistor is an element having at least three terminals of gate, drain, and source. The transistor includes a channel region between a drain region and a source region, and current can flow through the drain region, the channel region, and the source region. Here, since source and drain are switched with each other depending on the structure, operating condition, or the like of the transistor, it is difficult to determine which is the source or the drain in some cases. Accordingly, in this embodiment, one of regions which function as source and drain is referred to as a first terminal and the other region is referred to as a second terminal in some cases. Further, a terminal which functions as gate is referred to as a gate terminal in some cases.

Note that a voltage in each wiring, which is described in this specification, corresponds to a potential difference with a ground potential GND (also referred to as a ground voltage GND, VGND, or 0) used as a reference voltage. Accordingly, voltage is referred to as potential or potential is referred to as voltage in some cases.

Next, operation of the semiconductor memory device 100 shown in FIGS. 1A and 1B will be described with reference to FIGS. 3A to 3C, FIGS. 4A to 4C, and FIG. 5. Note that FIGS. 3A to 3C and FIGS. 4A to 4C show a memory cell MC (1, 1), a memory cell MC (1, 2), a memory cell MC (2, 1), and a memory cell MC (2, 2) in which data is Written and read by a first bit line B1 or a second bit line B2, and a first word line W1 or a second word line W2 for description.

Figure 3A:
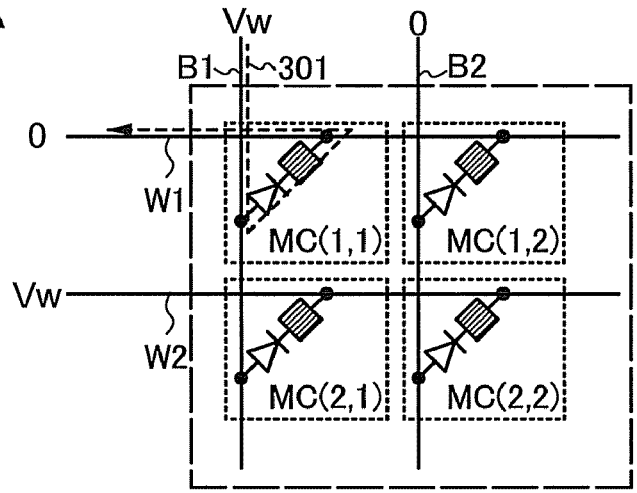
FIGS. 3A to 3C are diagrams for describing Embodiment 1.

First, writing of data in the memory cell is described. As described above, the anti-fuse used in one embodiment of the present invention is in a non-conduction state (resistance $R_O$) at the time of manufacturing and turns to a conductive state (resistance $R_W$) due to electrical connection between a first terminal and a second terminal of the anti-fuse by flowing current after the manufacturing so that information is written. Note that the relation between the amount of resistance values of the resistance $R_O$ and the resistance $R_W$ is $R_O$ is much greater than $R_W$. Accordingly, by applying a high voltage between the first terminal and the second terminal of the anti-fuse to flow current, information is written. In specific, in the case where data is written by flowing current to the memory cell MC (1, 1), a writing voltage Vw, a voltage of 0V, a voltage of 0V, and a writing voltage Vw are applied to the first bit line B1, the second bit line B2, the first word line W1, and the second word line W2, respectively as shown in FIG. 3A. Then, as shown by an arrow 301 in FIG. 3A, current flows from the first bit line B1 to the first word line W1 side through the PIN diode and the anti-fuse. That is, the anti-fuse is in a conduction state in which information is written by application of a high voltage between the first terminal and the second terminal of the anti-fuse. Note that the writing voltage Vw is higher than a reading voltage Vr which is applied at the time of reading data; the relation between the writing voltage Vw and the reading voltage Vr is Vw>Vr>0. In other words, in the state shown in FIG. 3A, the memory cell operates so as to switch the voltages of the first word line W1 and the first bit line B1 in the memory cell MC (1, 1) as shown by a period 501 in FIG. 5.

Figure 4A:
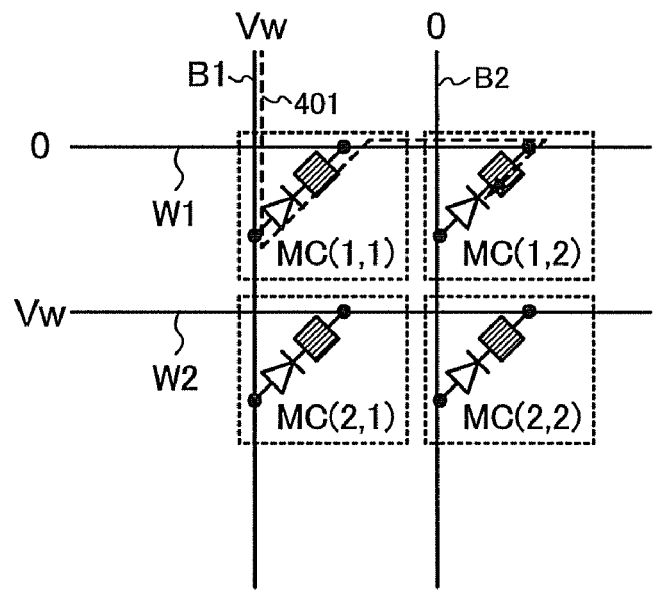
FIGS. 4A to 4C are diagrams for describing Embodiment 1.

Note that in a state of FIG. 3A, current (the arrow 301 in FIG. 3A) which flows from the first bit line B1 to the first word line W1 through the memory cell MC (1, 1) flows to the memory cell MC (1, 2) through the first word line W1 (as shown by an arrow 401 in FIG. 4A). However, a diode is electrically connected to each memory cell so as to make current flows from the bit line side to the word line side in forward direction. Therefore, current can be prevented from flowing from the word line side to the bit line side. According to one embodiment of the present invention, the memory cell is formed using, in particular, a PIN diode. Since the PIN diode can have higher impedance than the PN diode, current leakage from memory cells besides a selected memory cell can be suppressed.

Figure 4B:
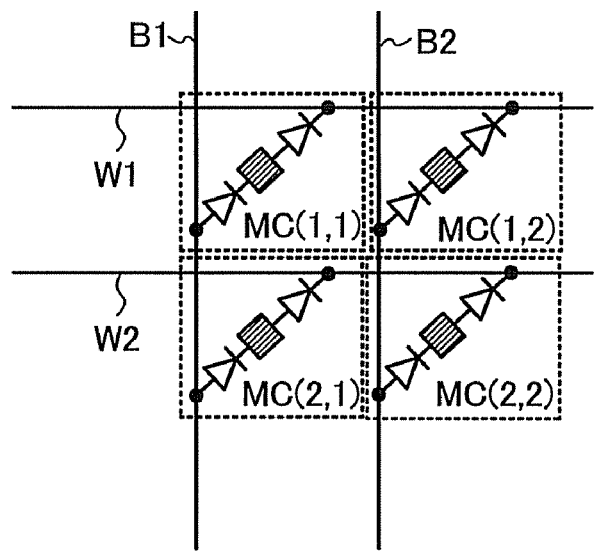
Figure 4C:
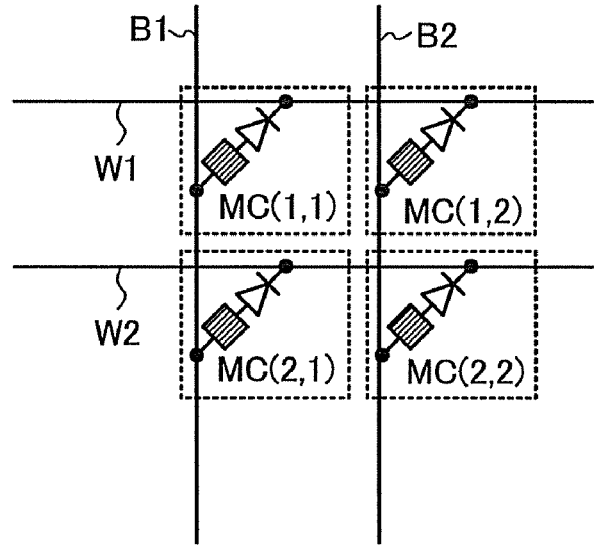
Figure 5:
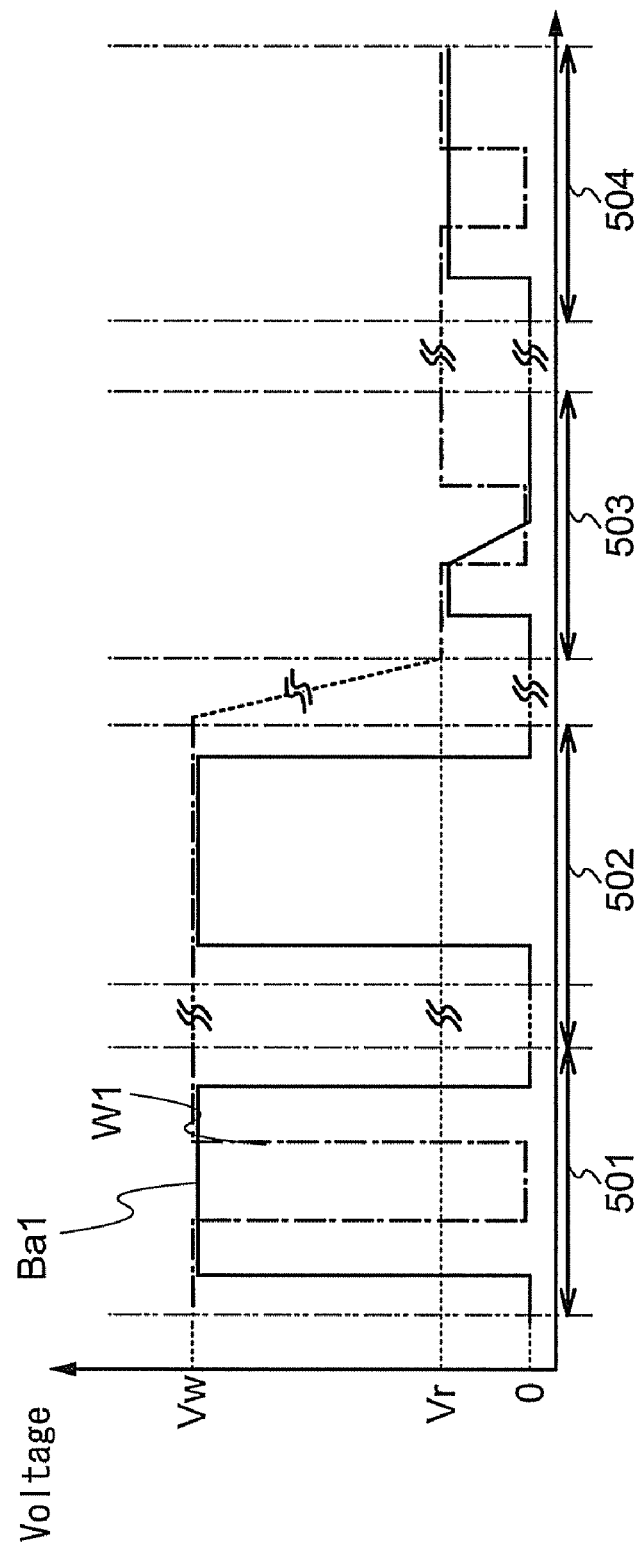
FIG. 5 is a diagram for describing Embodiment 1.

Note that as shown in FIG. 4B, a PIN diode may be added to form the memory cell. By connecting the PIN diodes in FIG. 4B in series, when the current flows as shown in FIG. 4A, current leakage can be further suppressed. Note that as shown in FIG. 4C, even if the positions of the PIN diode and the anti-fuse are switched, operation of the memory cell still has the same effect as one embodiment of the present invention.

Note that the voltage of the second word line W2 of the memory cell MC (2, 1) in which the voltage of the first bit line B1 is increased like that in the memory cell MC (1, 1) also increases. Therefore, data writing accompanying application of a voltage is not performed in the memory cell MC (2, 1). Note that in the state of FIG. 3A, the second word line W2 and the first bit line B1 in the memory cell MC (2, 1) operate so as to switch voltages thereof as shown by a period 502 in FIG. 5.

Figure 3B:
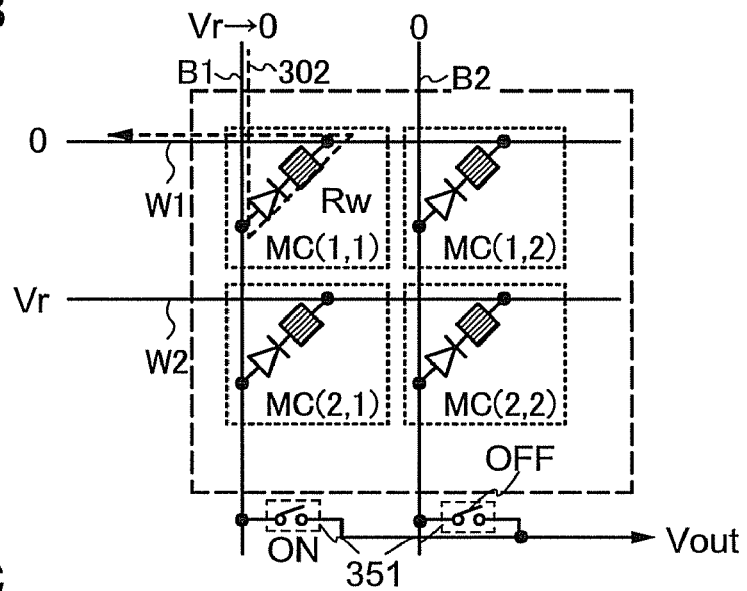
Figure 3C:
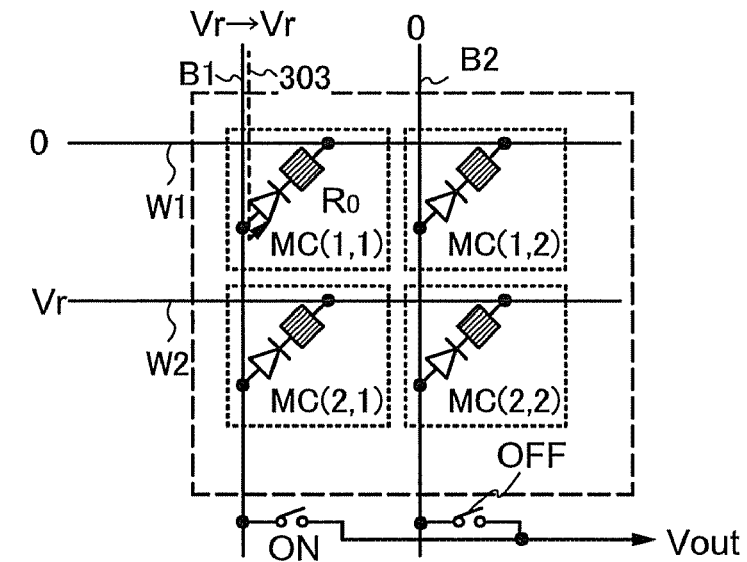

Next, data reading from the memory cell MC (1, 1) is described. With reference to FIG. 3B, data reading in the anti-fuse, that is, the anti-fuse the first terminal and the second terminal of which are electrically connected is described. In the case where data is read out from the memory cell MC (1, 1), the bit line is precharged with the reading voltage Vr. Then, the second bit line B2, the first word line W1, and the second word line W2 are set to have a voltage of 0V, a voltage of 0V, and the reading voltage Vr, respectively. Then, in the case where resistance $R_w$ between the first terminal and the second terminal of the anti-fuse is low and the first terminal and the second terminal of the anti-fuse are electrically connected, current flows from the first bit line B1 to the first word line W1 side through the PIN diode and the anti-fuse as shown by an arrow 302 in FIG. 3B. Then, the reading voltage Vr precharged in the first bit line B1 decreases to 0V with time. The voltage in each bit line is read out as an output voltage of 0V by controlling on and off of a switch 351 electrically connected to each bit line. Further, in FIG. 3B, the voltages of the first word line W1 and the first bit line B1 of the memory cell MC (1, 1) operate so as to switch voltages thereof to each other as shown by a period 503 in FIG. 5.

Note that in this specification, any switch can be used as long as it can control conduction and non-conduction between one terminal and the other terminal without any particular limitation. As a switch, an electrical switch, a mechanical switch, or the like can be given. A thin film transistor may be used to form an analog switch or the like, for example.

The anti-fuse in which data is written is described for showing data reading from the memory cell MC (1, 1) with reference to FIG. 3B. Subsequently, an anti-fuse in which data is not written will be described with reference to FIG. 3C. In other words, data reading in the case where the first terminal and the second terminal of the anti-fuse are not electrically connected will be described. In the case where data is read out from the memory cell MC (1, 1), the bit line is precharged with the reading voltage Vr. Then, the second bit line B2, the first word line W1, and the second word line W2 are precharged with a voltage of 0V, a voltage of 0V, and the reading voltage Vr, respectively. Then, in the case where resistance $R_0$ between the first terminal and the second terminal of the anti-fuse is high and the first terminal and the second terminal of the anti-fuse are not electrically connected, current does not flow from the first bit line B1 to the first word line W1 side as shown by an arrow 303 in FIG. 3C. Accordingly, the reading voltage Vr precharged in the first bit line B1 does not change. From each bit line, the voltage Vr is read out as an output voltage by controlling on and off of a switch electrically connected to each bit line. In other words, in FIG. 3C, the voltages of the first word line W1 and the first bit line B1 of the memory cell MC (1, 1) operate so as to switch the voltages thereof as shown by a period 504 in FIG. 5.

Note that although the structure in which data writing and data reading in the memory cell are performed in each individual memory cell is shown by the above description, data writing and data reading can be performed in a plurality of memory cells at the same time. By employing the structure in which data writing and data reading can be performed in a plurality of memory cells at the same time, processing speed for data writing and data reading can be increased.

Here, for comparison, a circuit configuration of a semiconductor memory device in the case of using a transistor and an anti-fuse will be described.

Figure 6A:
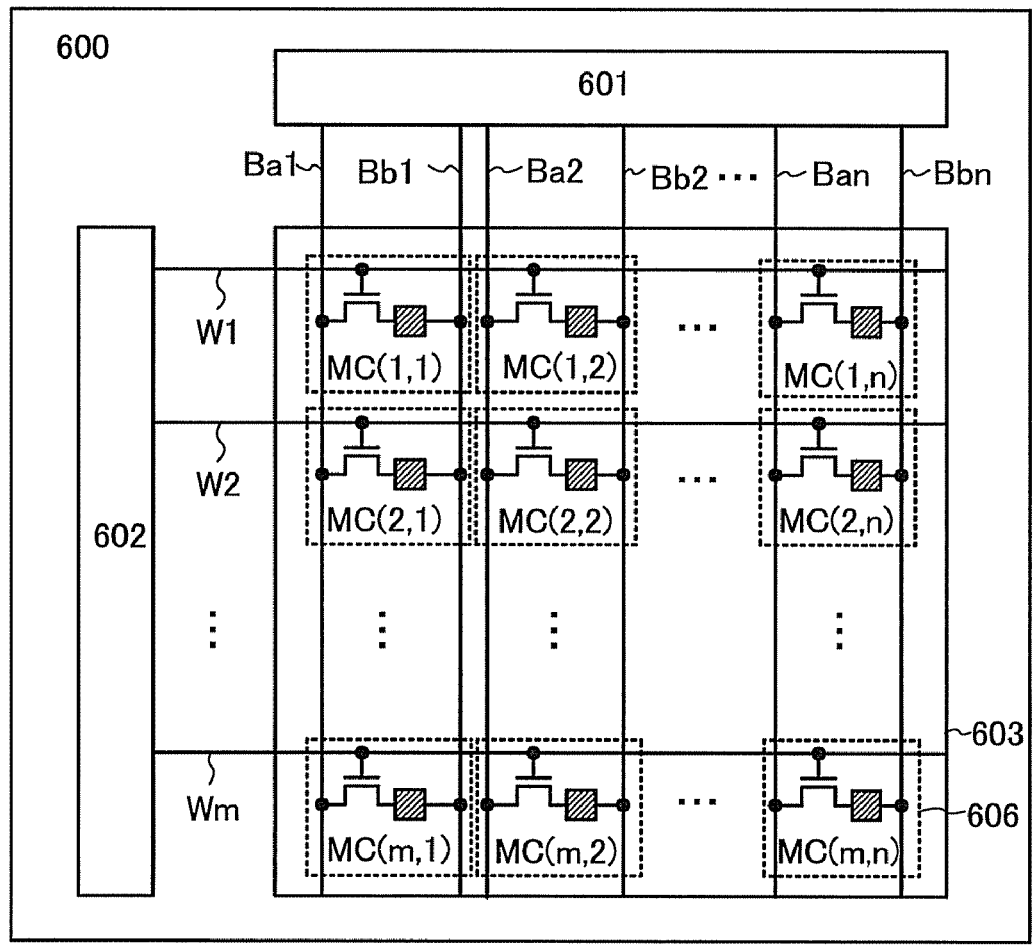
FIGS. 6A and 6B are diagrams for describing Embodiment 1.

A semiconductor memory device 600 shown in FIG. 6A includes a bit line driver circuit 601, a word line driver circuit 602, and a memory cell array 603. FIG. 6A illustrates an example of the memory cell array 603 in which (m×n) memory cells 606 ((MC (1, 1) to MC(m, n)) are arranged in matrix so as to align m memory cells in column and n memory cells in row like in FIG. 1A.

Figure 6B:
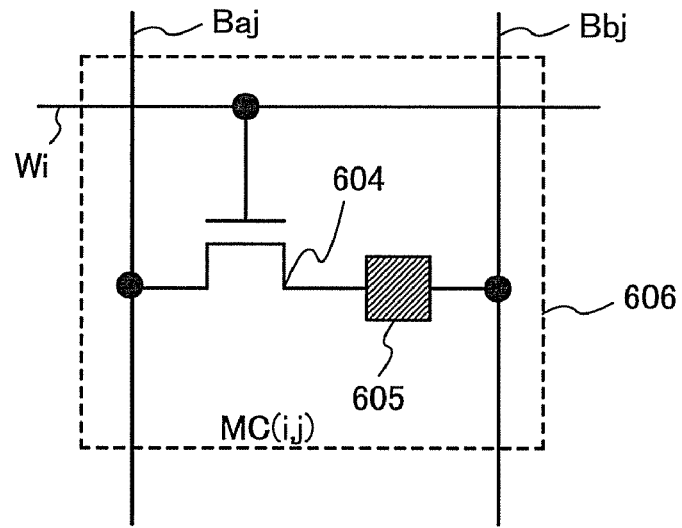

In addition, as shown in FIG. 6B, each of the memory cells 606 (the memory cell MC (i, j) as a representative) (i is an integer greater than or equal to 1 and less than or equal to m and j is an integer greater than or equal to 1 and less than or equal to n) includes a thin film transistor 604 and an anti-fuse 605. A gate electrode of the thin film transistor 604 is electrically connected to a word line Wi and a first terminal of the thin film transistor 604 is electrically connected to a first bit line Baj, and the second terminal of the thin film transistor 604 is electrically connected to the first terminal of the anti-fuse 605. Further, a second terminal of the anti-fuse 605 is electrically connected to a second bit line Bbi.

Since the PIN diode is used for the memory cell in the semiconductor memory device according to one embodiment of the present invention, two wirings are required as wirings for controlling an element as shown in FIG. 1B. On the other hand, the structure of FIG. 6B in which a thin film transistor is used for a memory cell requires three wirings in total: two bit lines and one word line. That is, in the structure of the semiconductor memory device according to one embodiment of the present invention, the number of wirings can be reduced and miniaturization can be achieved. In addition, each memory cell in the semiconductor memory device according to one embodiment of the present invention includes a PIN diode. Since the PIN diode can have higher impedance than the PN diode, current leakage can be suppressed and malfunction in data writing and reading can be reduced. Further, in the case of the PIN diode, since the size of an element can be smaller as compared to the case of the thin film transistor, the semiconductor memory device can be further integrated.

This embodiment can be combined with another embodiment as appropriate.

Embodiment 2

In this embodiment, an example of an element structure of the anti-fuse which is described in Embodiment 1 is described.

Figure 7:
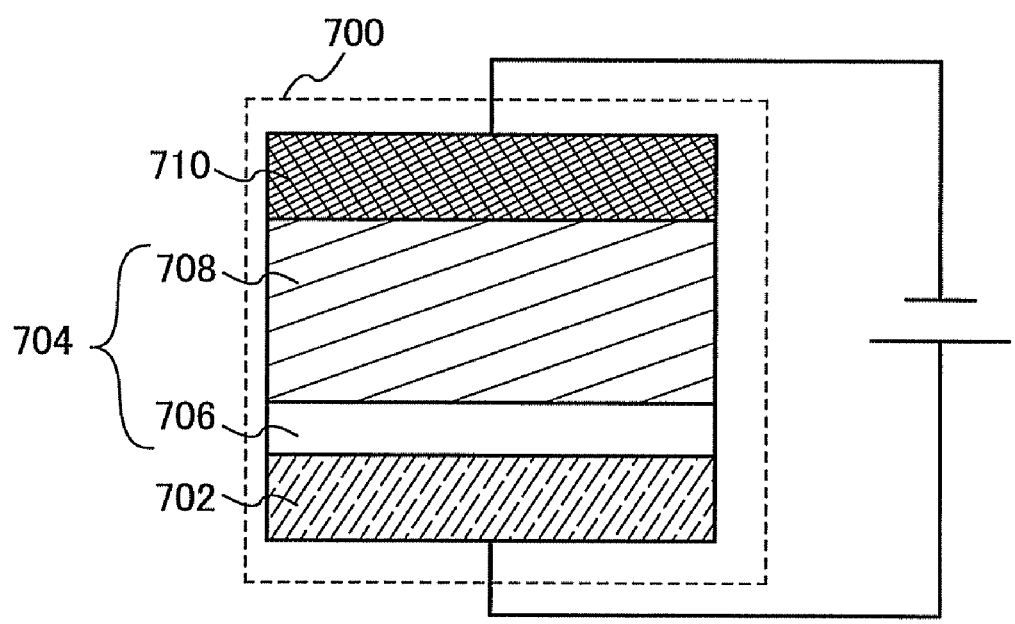
FIG. 7 is a diagram for describing Embodiment 2.

FIG. 7 shows a schematic view of an anti-fuse 700 in cross section. In this embodiment, the anti-fuse 700 has a structure in which an insulating layer 706, a silicon layer 708, and a second electrode 710 are stacked in this order over a first electrode 702. The insulating layer 706 and the silicon layer 708 function as a resistance material layer 704. Note that the first electrode 702 described with reference to FIG. 7 corresponds to the first terminal of the anti-fuse described in Embodiment 1 and the second electrode 710 corresponds to the second terminal of the anti-fuse described in Embodiment 1. Note that although the order of stacking the insulating layer 706 and the silicon layer 708 can be reversed, by employing a layered structure shown in FIG. 7, electrical resistance value in a conduction state can be further reduced, which is preferable.

As described in Embodiment 1, the anti-fuse 700 is in a non-conduction state before writing. Therefore, the anti-fuse 700 in that state has a high electric resistance. To the anti-fuse 700 like this, a predetermined voltage (a breakdown voltage) is applied between the first electrode 702 and the second electrode 710, whereby a short circuit occurs between a silicon layer for forming the resistance material layer and the electrode which is in contact with the silicon layer. Here, a silicide reaction occurs because the silicon layer is formed. A region where a silicide reaction occurs becomes a conduction region, and thus, the resistance of the resistance material layer is partly or entirely reduced. Accordingly, the electric resistance of the anti-fuse 700 is changed before and after application of the breakdown voltage. By making the thus obtained high resistance state and low resistance state correspond to binary value data of "0" and "1", data writing and data reading can be performed.

Next, a method for manufacturing the anti-fuse 700 is described.

First, the first electrode 702 is formed. The first electrode 702 is formed using a substance such as tungsten, titanium, aluminum, nickel, chromium, molybdenum, tantalum, cobalt, zirconium, vanadium, palladium, hafnium, platinum, or iron, or an alloy or a compound which includes one or a plurality of these materials. After forming a conductive layer using the above-described material by an evaporation method, a sputtering method, a printing method, a plating method, or the like, the conductive layer is selectively etched, whereby the conductive layer can be processed into a desired shape.

Next, the resistance material layer 704 is formed over the first electrode 702. The resistance material layer 704 may be formed using a layer the state of which can be changed from a high resistance state to a low resistance state by an electric signal. In this embodiment, the insulating layer 706 is formed over the first electrode 702, and the silicon layer 708 is formed over the insulating layer 706.

The insulating layer 706 is formed using silicon oxide, silicon nitride, silicon oxynitride, silicon nitride oxide, or the like by a CVD method, a sputtering method, an ALD (atomic layer deposition) method, or the like. Alternatively, the insulating layer 706 can be formed by subjecting the first electrode 702 to surface treatment. As the surface treatment, oxidation treatment, nitridation treatment, oxynitridation treatment, or the like can be used. The thickness of the insulating layer 706 may be approximately 1 to 20 nm, preferably 1 to 15 nm.

The silicon layer 708 is formed using a material containing silicon as its main component by a CVD method, a sputtering method, or the like. A crystal structure of the silicon layer 708 may be any of amorphous silicon, microcrystalline silicon, and polycrystalline silicon, and a plurality of crystal structures may be mixed in the silicon layer 708. The thickness of the silicon layer 708 may be approximately 1 to 200 nm, preferably 5 to 100 nm.

Note that when amorphous silicon is used as the silicon layer 708, amorphous silicon containing hydrogen (hereinafter, also referred to as "hydrogenated amorphous silicon") can also be used. The hydrogenated amorphous silicon here means amorphous silicon containing hydrogen at approximately greater than or equal to 2 atomic %, preferably at approximately greater than or equal to 2 atomic % and less than or equal to 20 atomic %. It is considered that, by using hydrogenated amorphous silicon for the resistance material layer, a short circuit between the electrodes due to a silicide reaction can easily occur. In such hydrogenated amorphous silicon, hydrogen can be contained at the time of film formation, or can be contained by adding hydrogen in a separate step after film formation. For example, film formation is performed in a gas containing hydrogen by a plasma CVD method, whereby hydrogenated amorphous silicon can be formed. At this time, the amount of hydrogen contained in hydrogenated amorphous silicon can be adjusted by setting film formation conditions (gas composition, gas pressure, gas atmosphere, gas flow rate, a temperature of a chamber, a substrate temperature, applied power, or the like), as appropriate. Alternatively, hydrogen can be contained by adding hydrogen by an ion implantation method or an ion doping method after forming amorphous silicon which does not contain much hydrogen by an LPCVD method or the like. Note that in the case where hydrogenated amorphous silicon is formed by containing hydrogen at the time of film formation, it is preferable that hydrogenated amorphous silicon be formed in a low-temperature process, specifically, at a temperature of lower than or equal to 350° C. Further, a process temperature after forming hydrogenated amorphous silicon is preferably lower than or equal to 350° C. in order to prevent dehydrogenation.

Next, the second electrode 710 is formed over the resistance material layer 704. The second electrode 710 may be formed using a material and a method which are similar to that of the first electrode 702. Specifically, the second electrode 710 may be formed using a substance such as tungsten, titanium, aluminum, nickel, chromium, molybdenum, tantalum, cobalt, zirconium, vanadium, palladium, hafnium, platinum, or iron, or an alloy or a compound which includes one or a plurality of these materials. A method for manufacturing the second electrode 710 may be as follows: a conductive layer is formed by an evaporation method, a sputtering method, a printing method, a plating method, or the like, and then, the conductive layer is selectively etched, whereby the conductive layer is processed into a desired shape. Further, the second electrode 710 may be formed using the same material as the first electrode 702 or may be formed using a material different from the first electrode 702.

In this manner, by interposing the insulating layer and the silicon layer between the electrodes, the anti-fuse 700 in this embodiment can be obtained.

This embodiment can be combined with another embodiment as appropriate.

Embodiment 3

Figure 8A:
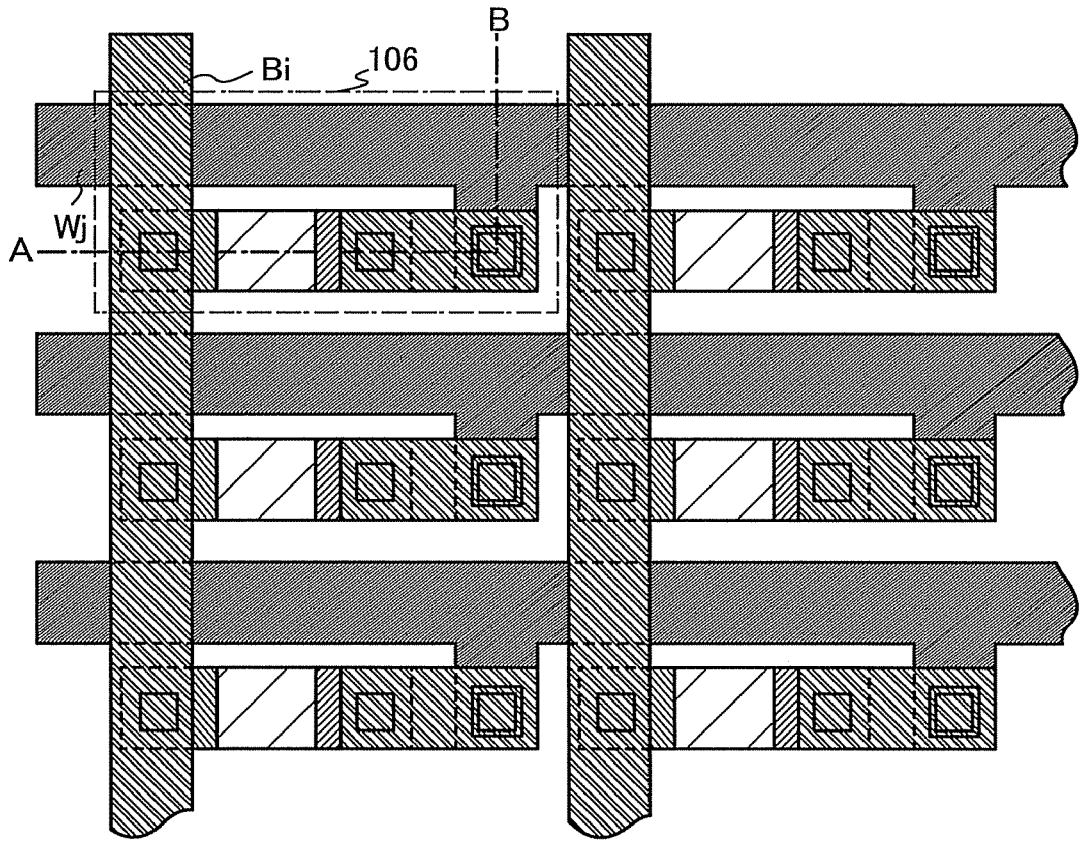
FIGS. 8A and 8B are diagrams for describing Embodiment 3.
Figure 8B:
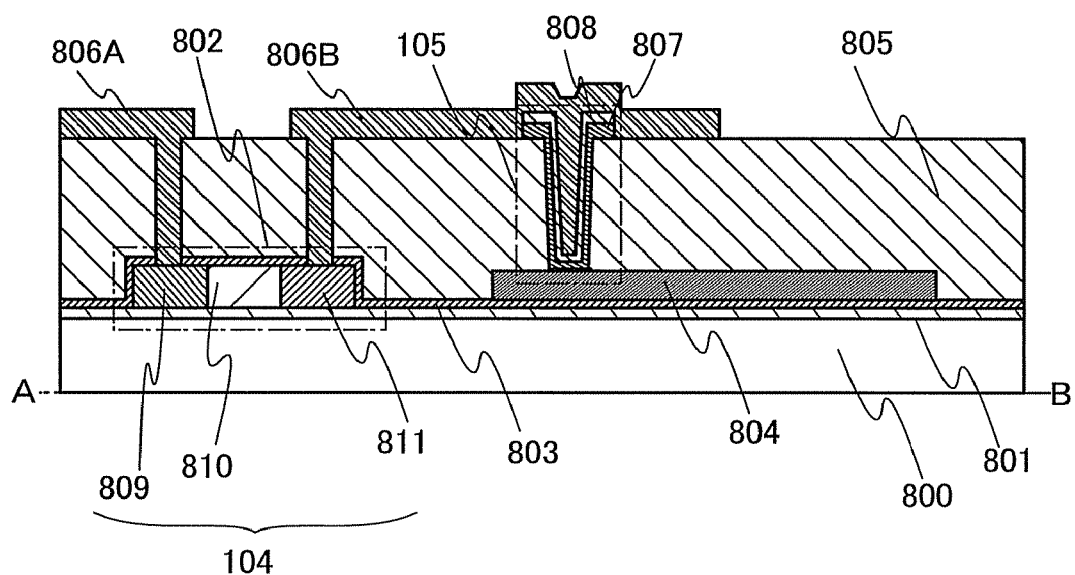
Figure 9A:
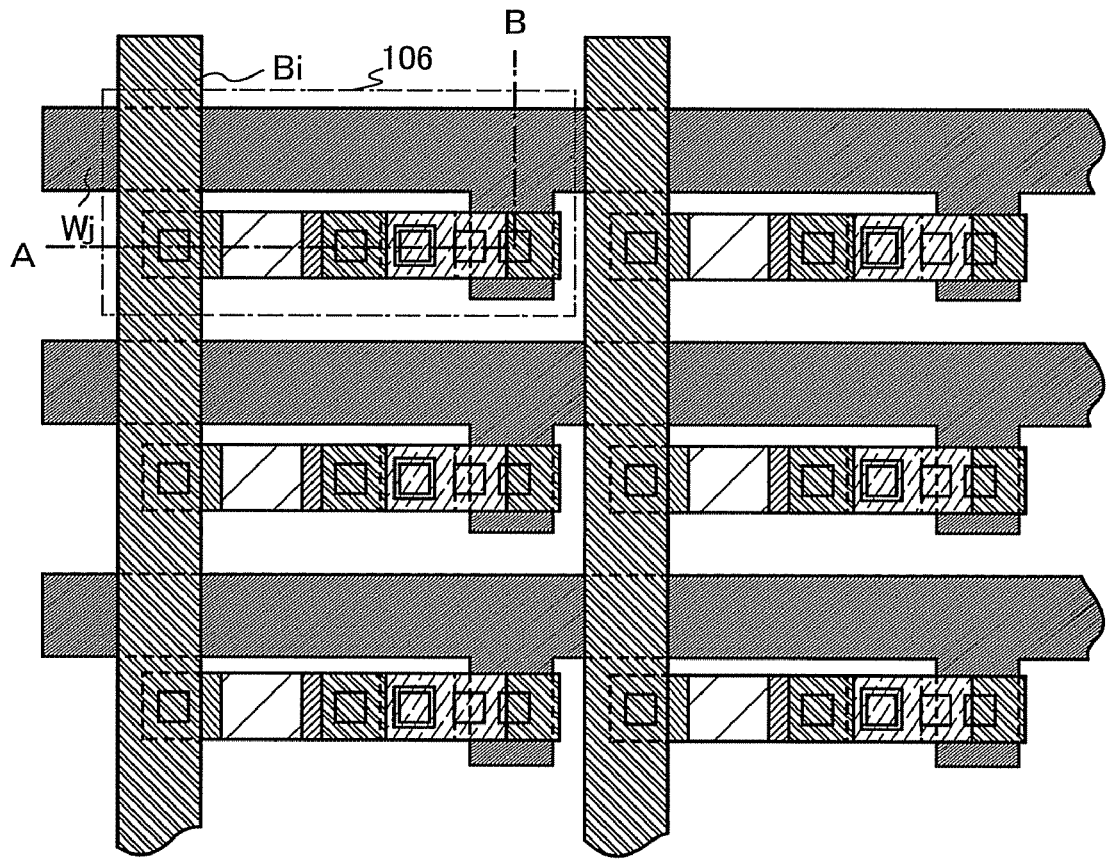
FIGS. 9A and 9B are diagrams for describing Embodiment 3.
Figure 9B:
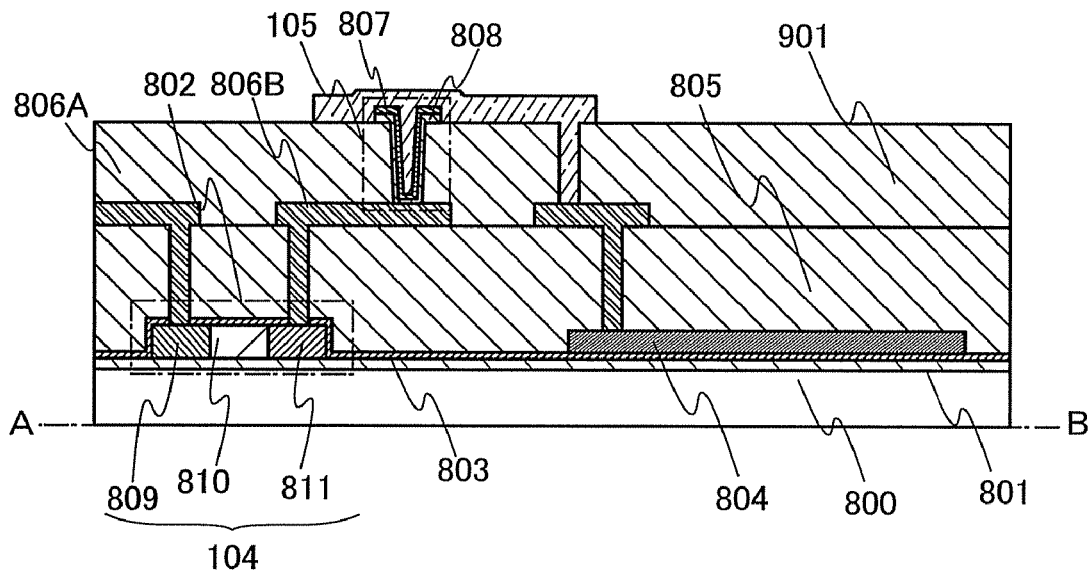

In this embodiment, a top view of a semiconductor memory device and a cross-sectional view of the semiconductor memory device which corresponds to the top view thereof will be described. FIG. 8A is a top view of a memory cell of the semiconductor memory device and FIG. 8B is a cross-sectional view of the memory cell of the semiconductor memory device along line A-B in FIG. 8A. Further, FIG. 9A is a top view of a memory cell of a semiconductor memory device and FIG. 9B is a cross-sectional view of the memory cell of the semiconductor memory device along line A-B in FIG. 9A. Note that each element shown in the top views and the cross-sectional views in this embodiment is illustrated with an exaggerated scale in order to clearly describe the structures.

FIG. 8A shows bit lines Bi and word lines Wj which are arranged in grid. The memory cells 106 are connected to the bit lines Bi and the word lines Wj. A plurality of bit lines and a plurality of word lines are arranged so as to extend in the X direction and the Y direction, respectively.

Further, in FIG. 8B, a blocking film 801, a semiconductor layer 802, an insulating layer 803, a first conductive layer 804, a first interlayer film 805, second conductive layers 806A and 806B, a silicon layer 807, and an insulating layer 808 are provided over a supporting substrate 800. Note that by providing a p-type semiconductor region 809 which is connected to the second conductive layer 806A, an intrinsic semiconductor region 810, and an n-type semiconductor region 811 which is connected to the second conductive layer 806B side by side in the semiconductor layer 802, the PIN diode 104 is formed. Further, the anti-fuse 105 is formed using the second conductive layer 806B, the silicon layer 807, the insulating layer 808, and the first conductive layer 804. Note that the second conductive layer 806A corresponds to the bit line Bi in FIG. 8A and the second conductive layer 804 corresponds to the word line Wj in FIG. 8A.

With the layered structure shown in FIG. 8B, the PIN diode can be obtained by providing the p-type semiconductor region, the intrinsic semiconductor region, and the n-type semiconductor region side by side, so that a logic circuit formed using TFT and the like can be formed over the same substrate as the semiconductor memory device through a common process. Therefore, a production cost and a production time can be reduced, which is preferable. For example, the semiconductor layer 802 can be formed in the same process as a semiconductor layer of the TFT. In addition, the first conductive layer 804 can be formed in the same process as a gate electrode of the TFT. Further, the second conductive layers 806A and 806B can be formed in the same process as a source and drain electrodes of the TFT.

Note that a quartz substrate, a silicon substrate, a metal substrate, a stainless steel substrate, or the like in addition to a glass substrate or a flexible substrate can be used for the supporting substrate 800. The flexible substrate refers to a substrate which can be bent (is flexible). For example, a plastic substrate or the like formed using polycarbonate, polyalylate, polyethersulfone, or the like can be given. Alternatively, an attachment film (formed using polypropylene, polyester, vinyl, polyvinyl fluoride, polyvinyl chloride, or the like), paper of a fibrous material, a base material film (polyester, polyamide, an inorganic vapor deposition film, paper, or the like), or the like can be used.

In addition, as the supporting substrate 800, any of the following substrates can be used: a single-crystal silicon substrate which has n-type or p-type conductivity, a compound semiconductor substrate (e.g., a GaAs substrate, an InP substrate, a GaN substrate, a SiC substrate, a sapphire substrate, or a ZnSe substrate), and an SOI (silicon on insulator) substrate which is manufactured using a bonding method or a SIMOX (separation by implanted oxygen) method. Alternatively, a glass substrate to which single-crystal silicon is attached can be used. Note that the blocking film 801 may be provided depending on diffusion of movable ions from the supporting substrate as appropriate. For example, a silicon oxide, a silicon nitride, a silicon oxynitride, or the like can be used for the blocking film 801.

Further, as the semiconductor layer 802, a single-layer structure or a stacked-layer structure of amorphous silicon, polycrystalline silicon, microcrystalline (also referred to as microcrystal or semi-amorphous) silicon, or the like can be used. The semiconductor layer 802 can be formed by a sputtering method, an LPCVD method, a plasma CVD method, or the like.

As the insulating layer 803, for example, any one or a plurality of silicon oxide, silicon nitride, a silicon oxynitride, and silicon nitride oxide can be used.

As the first interlayer film 805, an organic material or an inorganic material can be used. For example, one or a plurality of silicon oxide, silicon nitride, silicon oxynitride, and silicon nitride oxide, or one or a plurality of polyimide, acrylic, a polyamide, polyimide amide, benzocyclobutene, siloxane, and polysilazane can be applied.

Like the first electrode and the second electrode described in Embodiment 2, as the first conductive layer 804 and the second conductive layers 806A and 806B, one of tungsten, titanium, aluminum, nickel, chromium, molybdenum, tantalum, cobalt, zirconium, vanadium, palladium, hafnium, platinum, and iron, or an alloy or a compound which includes one or a plurality of these materials can be used. Further, the silicon layer 807 and the insulating layer 808 may be formed in a similar manner as the silicon layer and the insulating layer described in Embodiment 2.

Further, FIG. 9A shows bit lines Bi and word lines Wj which are arranged in grid like in FIG. 8A. The memory cells 106 are connected to the bit lines Bi and the word lines Wj. A plurality of bit lines and a plurality of word lines are arranged so as to extend in the X direction and the Y direction, respectively.

Further, in FIG. 9B, the blocking film 801, the semiconductor layer 802, the insulating layer 803, the first conductive layer 804, the first interlayer film 805, the second conductive layers 806A and 806B, the silicon layer 807, the insulating layer 808, and a second interlayer film 901 are provided over the supporting substrate 800. Note that by providing the p-type semiconductor region 809 which is connected to the second conductive layer 806A, the intrinsic semiconductor region 810, and the n-type semiconductor region 811 which is connected to the second conductive layer 806B in the semiconductor layer 802, the PIN diode 104 is formed. Further, the anti-fuse 105 is formed using the second conductive layer 806B, the silicon layer 807, the insulating layer 808, and the first conductive layer 804. Note that the second conductive layer 806A corresponds to the bit line Bi in FIG. 9A and the second conductive layer 804 corresponds to the word line Wj in FIG. 9A.

FIG. 9B is different from FIG. 8B in that the second interlayer film 901 is formed. As shown in FIG. 9B, by providing the second interlayer film 901, wirings and the like for the PIN diode 104 and the anti-fuse 105 can be provided in layers, so that miniaturization of the semiconductor memory device can be achieved.

With the layered structure shown in FIG. 9B, the PIN diode can be obtained by providing the p-type semiconductor region, the intrinsic semiconductor region, and the n-type semiconductor region side by side, so that a logic circuit formed using TFT and the like can be formed over the same substrate as the semiconductor memory device through a common process. Therefore, a production cost and a production time can be further reduced as compared to that in FIG. 8B, which is preferable.

Note that in FIGS. 8A and 8B and FIGS. 9A and 9B, portions which can be denoted by common reference numerals are denoted by the common reference numerals and described referring to each other.

As the second interlayer film 901, an organic material or an inorganic material can be used. For example, one or a plurality of silicon oxide, silicon nitride, silicon oxynitride, and silicon nitride oxide, or one or a plurality of polyimide, acrylic, a polyamide, polyimide amide, benzocyclobutene, siloxane, and polysilazane can be applied.

Note that this embodiment can be combined with any of other embodiments as appropriate.

Embodiment 4

Figure 10A:
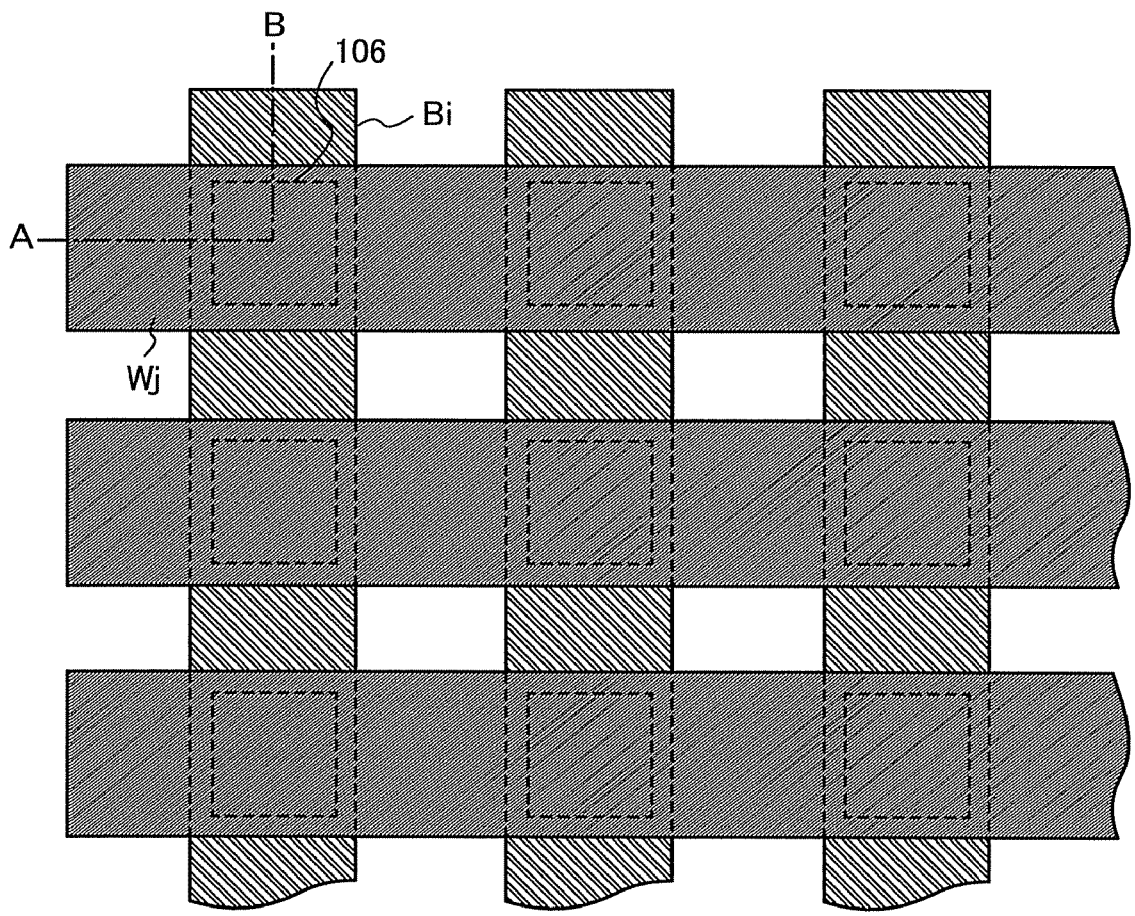
FIGS. 10A and 10B are diagrams for describing Embodiment 4.
Figure 10B:
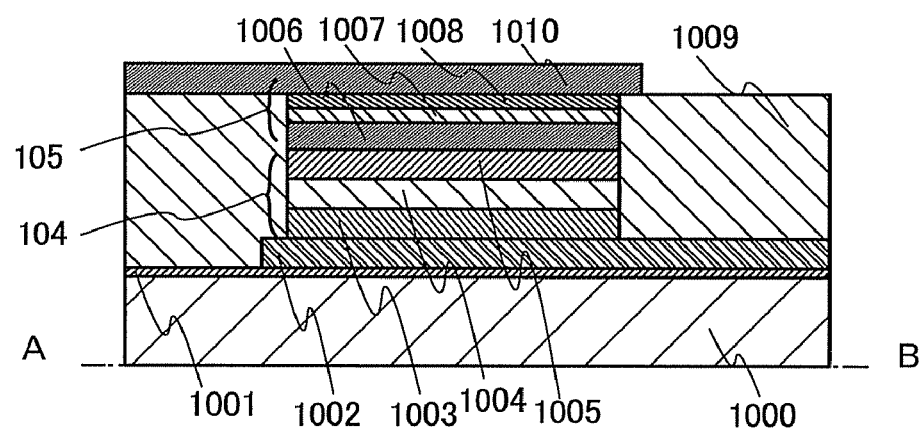
Figure 11A:
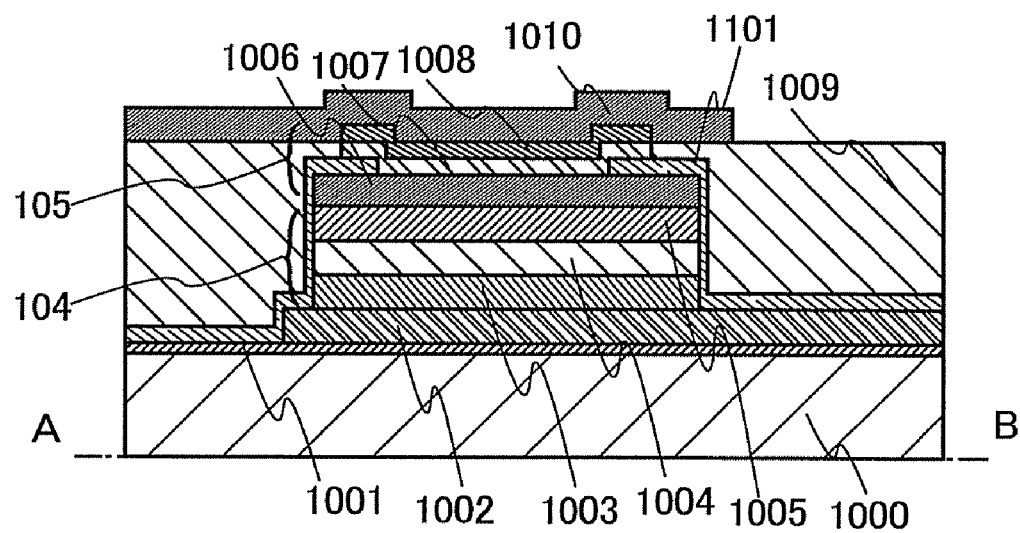
FIGS. 11A and 11B are diagrams for describing Embodiment 4.
Figure 11B:
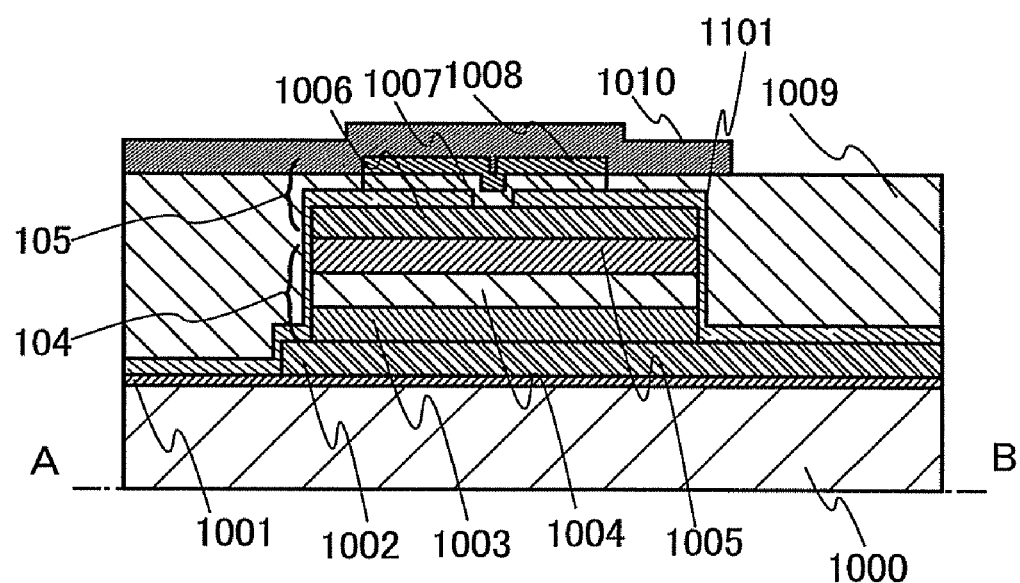
Figure 12A:
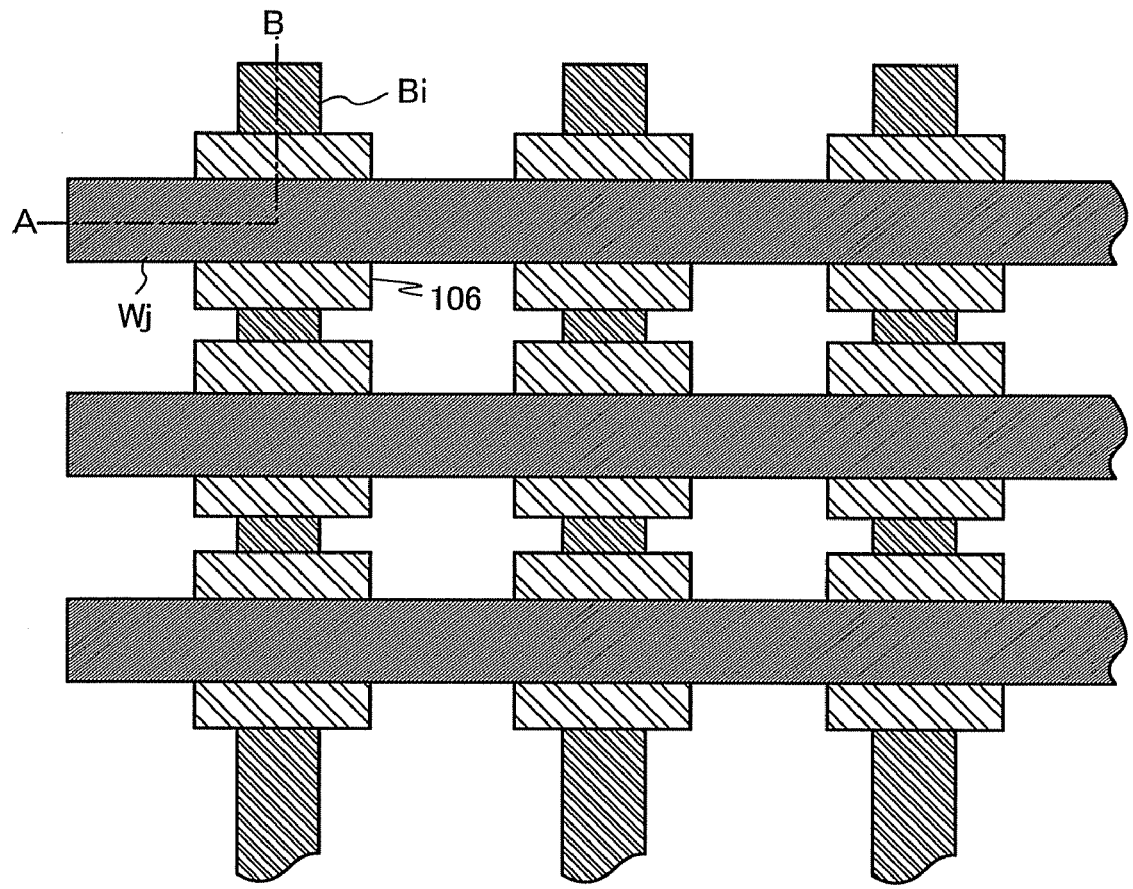
FIGS. 12A and 12B are diagrams for describing Embodiment 4.
Figure 12B:
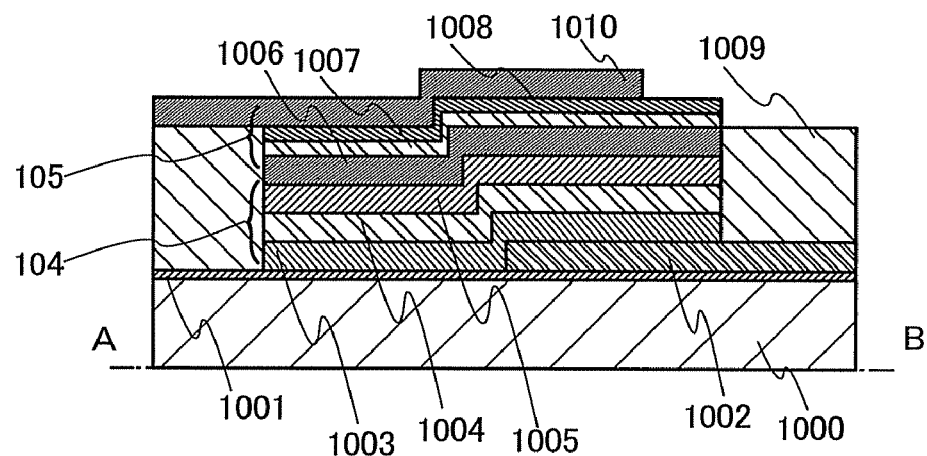
Figure 13A:
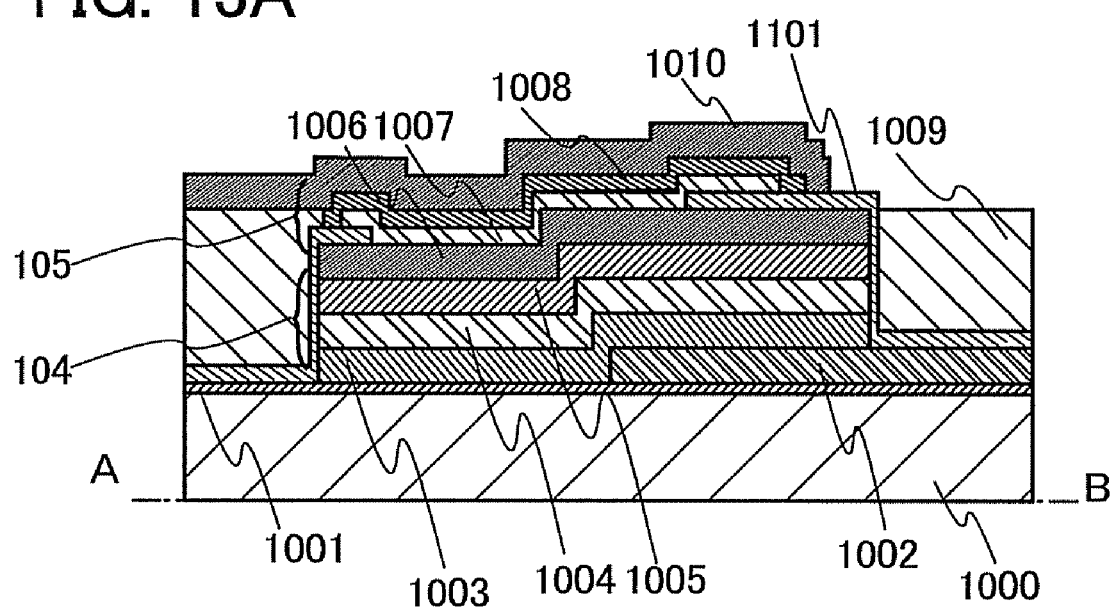
FIGS. 13A and 13B are diagrams for describing Embodiment 4.
Figure 13B:
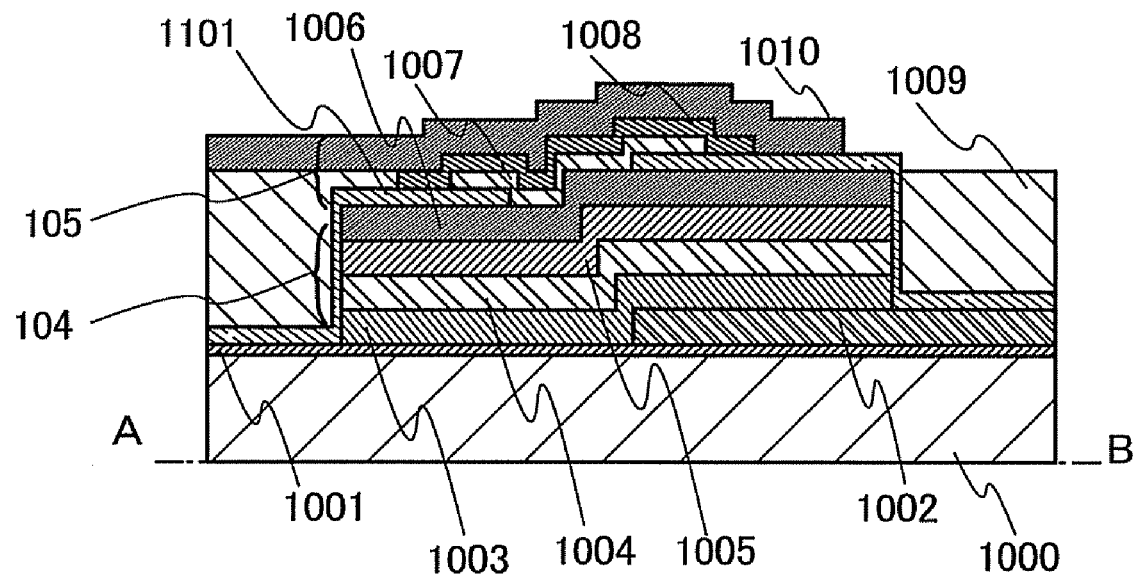

In this embodiment, a semiconductor memory device having different top view and cross-sectional structure from those of Embodiment 3 will be described. FIG. 10A is a top view of a memory cell of the semiconductor memory device. FIG. 10B and FIGS. 11A and 11B are cross-sectional views of FIG. 10A along line A-B. Further, FIG. 12A is a top view of a memory cell of the semiconductor memory device. FIG. 12B and FIGS. 13A and 13B are cross-sectional views of FIG. 12A along line A-B. Note that each element shown in the top views and the cross-sectional views in this embodiment is illustrated with an exaggerated scale in order to clearly describe the structures.

FIG. 10A shows bit lines Bi and word lines Wj which are arranged in grid. The memory cells 106 are connected to the bit lines Bi and the word lines Wj. A plurality of bit lines and a plurality of word lines are arranged so as to extend in the X direction and the Y direction, respectively. The semiconductor memory device of this embodiment is different from that of Embodiment 3 in that the memory cells 106 are provided on portions where the bit lines Bi and the word lines Wj intersect. By providing the memory cells 106 on the portions where the bit lines Bi and the word lines Wj intersect, the memory cell can be highly integrated and memory capacitance can be increased.

In FIG. 10B, a blocking film 1001, a first conductive layer 1002, a p-type semiconductor layer 1003, an intrinsic semiconductor layer 1004, an n-type semiconductor layer 1005, a second conductive layer 1006, an insulating layer 1007, a silicon layer 1008, a first interlayer film 1009, and a third conductive layer 1010 are provided over a supporting substrate 1000. Note that the PIN diode 104 includes the p-type semiconductor layer 1003, the intrinsic semiconductor layer 1004, and the n-type semiconductor layer 1005. Further, the anti-fuse 105 includes the second conductive layer 1006, the insulating layer 1007, the silicon layer 1008, and the third conductive layer 1010. Note that the first conductive layer 1002 corresponds to the bit line Bi in FIG. 10A and the third conductive layer 1010 corresponds to the word line Wj in FIG. 10A.

With the layered structure shown in FIG. 10B, the PIN diode can be obtained by providing the p-type semiconductor region, the intrinsic semiconductor region, and the n-type semiconductor region so as to make them overlap with each other, and the number of masks for processing the shape of each layer can be reduced, whereby a reduction in cost can be achieved.

Note that description of the supporting substrate 1000 and the blocking film 1001 is the same as that of the supporting substrate 800 and the blocking film 801 in Embodiment 3, respectively.

Description of the first conductive layer 1002, the second conductive layer 1006, and the third conductive layer 1010 is the same as that of the first conductive layer 804, the second conductive layer 806A, and the second conductive layer 806B in Embodiment 3, respectively.

Description of the insulating layer 1007 and the silicon layer 1008 is the same as that of the insulating layer 808 and the silicon layer 807 in Embodiment 3, respectively. However, the order of stacking the silicon layer and the insulating layer is different because connection with the PIN diode is different.

Description of the first interlayer film 1009 is the same as that of the first interlayer film 805 in Embodiment 3. Note that the first interlayer film 1009 is formed after stacking up to the silicon layer 1008 and processing the shape thereof. Note that in the processing, the silicon layer 1008 may be processed into a tapered shape. Then, after the first interlayer film 1009 is formed and part of the interlayer film 1009, which is over the silicon layer 1008, is removed, the third conductive layer 1010 may be formed over the silicon layer 1008.

Note that the p-type semiconductor layer 1003 may be formed by deposition of a semi-amorphous silicon film containing an impurity element which belongs to Group 13 of the periodic table, such as boron (B) by a plasma CVD method. Further, as the intrinsic semiconductor layer 1004, for example, a semi-amorphous silicon film may be formed by a plasma CVD method. Furthermore, as the n-type semiconductor layer 1005, a semi-amorphous silicon film containing an impurity element which belongs to Group 15 of the periodic table, for example, phosphorus (P) may be formed, or after formation of a semi-amorphous silicon film, an impurity element which belongs to Group 15 of the periodic table may be introduced. In addition, as the p-type semiconductor layer 1003, the intrinsic semiconductor layer 1004, and the n-type semiconductor layer 1005, not only a semi-amorphous semiconductor film but also an amorphous semiconductor film may be used.

In FIG. 11A, the blocking film 1001, the first conductive layer 1002, the p-type semiconductor layer 1003, the intrinsic semiconductor layer 1004, the n-type semiconductor layer 1005, the second conductive layer 1006, the insulating layer 1007, the silicon layer 1008, the first interlayer film 1009, a second interlayer film 1101, and the third conductive layer 1010 are provided over the supporting substrate 1000. Note that the PIN diode 104 is formed using the p-type semiconductor layer 1003, the intrinsic semiconductor layer 1004, and the n-type semiconductor layer 1005. Further, the anti-fuse 105 is formed using the second conductive layer 1006, the insulating layer 1007, the silicon layer 1008, and the third conductive layer 1010. Note that the first conductive layer 1002 corresponds to the bit line Bi in FIG. 10A and the third conductive layer 1010 corresponds to the word line Wj in FIG. 10A.

FIG. 11A is different from FIG. 10B in that the second interlayer film 1101 is formed. As shown in FIG. 11A, by providing the second interlayer film 1101, like the blocking film 1001, the second interlayer film 1101 can protect the PIN diode 104 from movable ions from the outside, whereby the life of the semiconductor memory device can be longer. Note that the second interlayer film 1101 is formed after stacking up to the second conductive layer 1006 and processing the shape thereof. Note that in the processing, the second interlayer film 1101 may be processed into a tapered shape.

In FIG. 11B, the blocking film 1001, the first conductive layer 1002, the p-type semiconductor layer 1003, the intrinsic semiconductor layer 1004, the n-type semiconductor layer 1005, the second conductive layer 1006, the insulating layer 1007, the silicon layer 1008, the first interlayer film 1009, the second interlayer film 1101, and the third conductive layer 1010 are provided over a supporting substrate 1000. Note that the PIN diode 104 is formed using the p-type semiconductor layer 1003, the intrinsic semiconductor layer 1004, and the n-type semiconductor layer 1005. Further, the anti-fuse 105 is formed using the second conductive layer 1006, the insulating layer 1007, the silicon layer 1008, and the third conductive layer 1010. Note that the first conductive layer 1002 corresponds to the bit line Bi in FIG. 10A and the third conductive layer 1010 corresponds to the word line Wj in FIG. 10A.

FIG. 11B is different from FIG. 11A in that the area of an opening portion for connecting the second conductive layer 1006 provided on the second interlayer film 1101 to the insulating layer 1007 is small. As shown in FIG. 11B, by making the area of the opening portion for connecting the second conductive layer 1006 to the insulating layer 1007 small, an element can be short-circuited more certainly when current flows to the anti-fuse. In addition, as described in FIG. 11A, like the blocking film 1001, the second interlayer film 1101 can protect the PIN diode 104 from movable ions from the outside, whereby the life of the semiconductor memory device can be longer.

Note that portions of FIGS. 11A and 11B and FIG. 10B which can be denoted by the same reference numerals are denoted by reference numerals in common and described with reference to each other.

Next, FIG. 12A shows bit lines Bi and word lines Wj which are arranged in grid. The memory cells 106 are connected to the bit lines Bi and the word lines Wj. A plurality of bit lines and a plurality of word lines are arranged so as to extend in the X direction and the Y direction, respectively. The semiconductor memory device of this embodiment is different from that of FIG. 10A in that the memory cells 106 are provided so as to be wider than the width of each of the bit lines Bi and the word lines Wj on portions where these wirings intersect. By providing the memory cells 106 so as to be wider than the width of each of the bit lines Bi and the word lines Wj on portions where these wirings intersect, degrees of freedom in arranging the memory cells can be increased and memory capacitance can be increased.

In FIG. 12B, the blocking film 1001, the first conductive layer 1002, the p-type semiconductor layer 1003, the intrinsic semiconductor layer 1004, the n-type semiconductor layer 1005, the second conductive layer 1006, the insulating layer 1007, the silicon layer 1008, the first interlayer film 1009, and the third conductive layer 1010 are provided over the supporting substrate 1000. Note that the PIN diode 104 is formed using the p-type semiconductor layer 1003, the intrinsic semiconductor layer 1004, and the n-type semiconductor layer 1005. Further, the anti-fuse 105 is formed using the second conductive layer 1006, the insulating layer 1007, the silicon layer 1008, and the third conductive layer 1010. Note that the first conductive layer 1002 corresponds to the bit line Bi in FIG. 12A and the third conductive layer 1010 corresponds to the word line Wj in FIG. 12A.

By employing the layered structure shown in FIG. 12B, as compared to the structure shown in FIG. 10B, a cross-sectional structure in which a stacked layer film for forming the PIN diode and the anti-fuse climb on the first conductive layer 1002 which is to be a bit line. Therefore, a portion whose thickness is reduced by a step of the first conductive layer 1002 can be intentionally formed in a cross-sectional view of each layer, an element can be short-circuited more certainly when current flows to the anti-fuse.

Note that description of the blocking film 1001, the first conductive layer 1002, the p-type semiconductor layer 1003, the intrinsic semiconductor layer 1004, the n-type semiconductor layer 1005, the second conductive layer 1006, the insulating layer 1007, the silicon layer 1008, the first interlayer film 1009, and the third conductive layer 1010 over the supporting substrate 1000 is the same as that in FIG. 10A.

In FIGS. 13A and 13B, the blocking film 1001, the first conductive layer 1002, the p-type semiconductor layer 1003, the intrinsic semiconductor layer 1004, the n-type semiconductor layer 1005, the second conductive layer 1006, the insulating layer 1007, the silicon layer 1008, the first interlayer film 1009, the second interlayer film 1101, and the third conductive layer 1010 are provided over the supporting substrate 1000. Note that the PIN diode 104 is formed using the p-type semiconductor layer 1003, the intrinsic semiconductor layer 1004, and the n-type semiconductor layer 1005. Further, the anti-fuse 105 is formed using the second conductive layer 1006, the insulating layer 1007, the silicon layer 1008, and the third conductive layer 1010. Note that the first conductive layer 1002 corresponds to the bit line Bi in FIG. 12A and the third conductive layer 1010 corresponds to the word line Wj in FIG. 12A.

FIGS. 13A and 13B are different from FIG. 12B in that the second interlayer film 1101 are formed, like FIGS. 11A and 11B. As shown in FIGS. 13A and 13B, like in FIGS. 11A and 11B, by providing the second interlayer film 1101, like the blocking film 1001, the second interlayer film 1101 can protect the PIN diode 104 from movable ions from the outside, whereby the life of the semiconductor memory device can be longer. Further, as shown in FIG. 13B, by making the area of the opening portion for connecting the second conductive layer 1006 to the insulating layer 1007 small, an element can be short-circuited more certainly when current flows to the anti-fuse. Note that the second interlayer film 1101 is formed after stacking up to the second conductive layer 1006 and processing the shape thereof. Note that in the processing, the second interlayer film 1101 may be processed into a tapered shape.

Note that portions of FIGS. 13A and 13B and FIG. 12B which can be denoted by the same reference numerals are denoted by reference numerals in common and described with reference to each other.

Note that this embodiment can be combined with any of the other embodiments as appropriate.

Embodiment 5

In this embodiment, a semiconductor device provided with a semiconductor memory device will be described as an application example of the semiconductor memory device according to one embodiment of the present invention.

A semiconductor device in this embodiment includes a memory circuit, stores information which is necessary for the memory circuit, and exchanges information with the outside by using contactless means, for example, wireless communication. With this feature, the semiconductor device in this embodiment has an application for an individual authentication system in which individual information of an object or the like is stored and the object is recognized by reading the information, for example. In order to use the semiconductor device in this embodiment for such an application, higher reliability is necessary because data on individual information is stored to recognize an object, for example.

Figure 14:
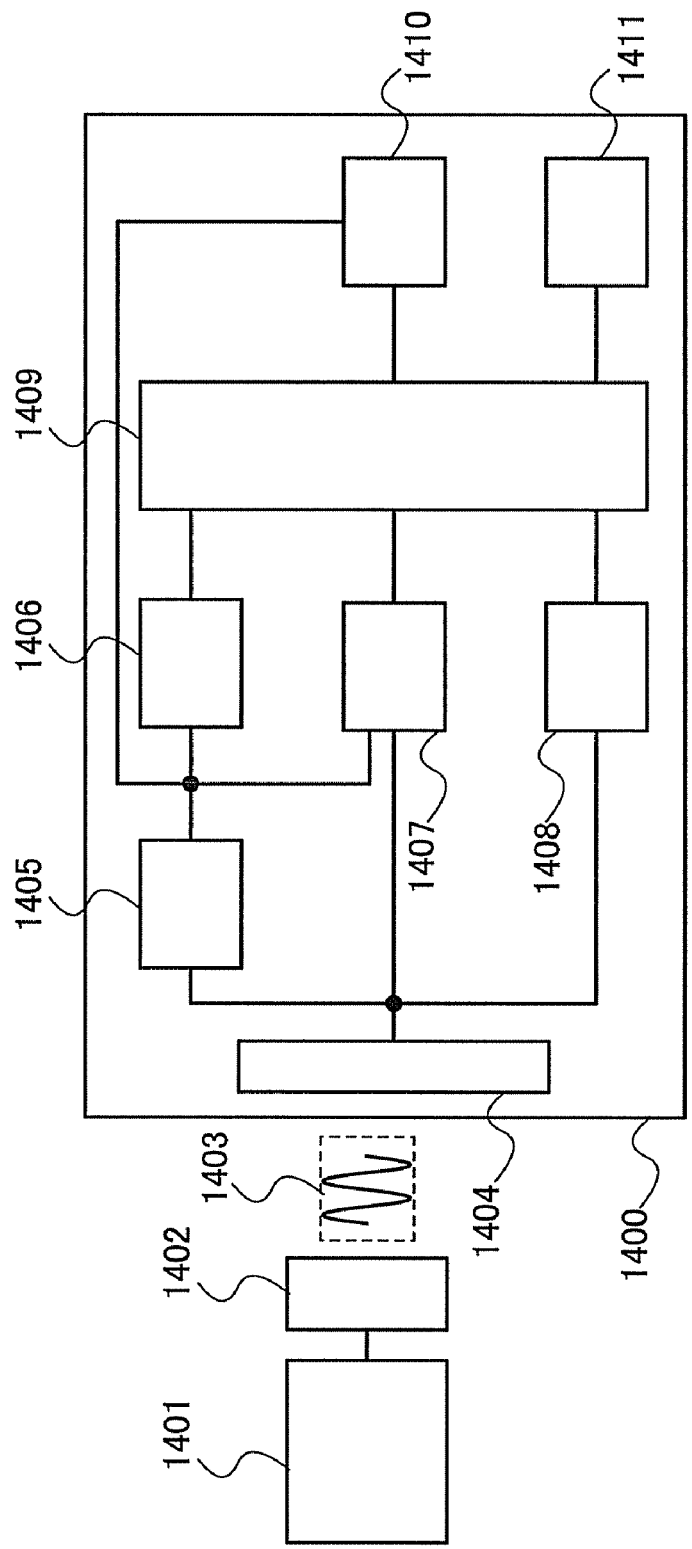
FIG. 14 is a diagram for describing Embodiment 5.

The structure of the semiconductor device in this embodiment is described with reference to FIG. 14. FIG. 14 is a block diagram showing a structure of the semiconductor device of this embodiment.

As shown in FIG. 14, a semiconductor device 1400 includes an antenna 1404 which receives a radio signal 1403 transmitted from an antenna 1402 connected to a reader/writer (also referred to as a wireless communication device or an interrogator) 1401. Further, the semiconductor device 1400 includes a rectifier circuit 1405, a constant voltage circuit 1406, a demodulation circuit 1407, a modulation circuit 1408, a logic circuit 1409, a semiconductor memory device 1410, and a ROM 1411. Note that data transmission methods are roughly classified into the following three methods: an electromagnetic coupling method, in which a pair of coils is provided so as to be faced with each other and communicates with each other by mutual induction, an electromagnetic induction method, in which communication is performed using an induction field, and an electromagnetic wave method, in which communication is performed using an electromagnetic wave. Any of these methods can be used in this embodiment.

Next, a structure of each circuit will be described. The antenna 1404 transmits and receives the radio signal 1403 with the antenna 1402 that is connected to the reader/writer 1401. In addition, the rectifier circuit 1405 generates an input potential by rectification, for example, half-wave voltage doubler rectification of an input alternating signal generated by reception of a radio signal at the antenna 1404 and smoothing of the rectified signal with a capacitor element provided in a lower stage. Note that a limiter circuit may be provided on an input side or an output side of the rectifier circuit 1405. The limiter circuit controls electric power so that electric power which is higher than or equal to certain electric power is not input to a circuit in a lower stage if the amplitude of the input alternating signal is high and an internal generation voltage is high. Further, the constant voltage circuit 1406 generates a stable power supply voltage from an input potential and supply it to each block. Furthermore, the constant voltage circuit 1406 may include a reset signal generation circuit inside. The reset signal generation circuit generates a reset signal of the logic circuit 1409 by utilizing rise of the stable power supply voltage. Further, the demodulation circuit 1407 demodulates the input alternating signal by envelope detection and generates the demodulated signal. Furthermore, the logic circuit 1409 analyzes and processes the demodulated signal. The semiconductor memory device 1410 includes the circuit configuration described in the above embodiments and is able to write data only one time in accordance with processing. Further, the ROM 1411 stores an identification number (ID) and outputs it in accordance with the processing. Note that the ROM 1411 may be provided as needed. Furthermore, the modulation circuit 1408 modulates data output from the antenna 1404.

In this embodiment, the semiconductor memory device according to one embodiment of the present invention can be mounted as the semiconductor memory device 1410 of the semiconductor device 1400. By employing the structure provided with the semiconductor memory device according to one embodiment of the present invention, the number of wirings can be reduced and miniaturization can be achieved. Further, malfunction in data writing or data reading can be reduced.

Note that this embodiment can be combined with any of the other embodiments as appropriate.

Embodiment 6

In this Embodiment, a manufacturing method of a semiconductor device provided with an anti-fuse semiconductor memory device will be described below with reference to FIGS. 15A to 15D and FIGS. 16A to 16C. Here, an example of manufacturing a semiconductor device in which a logic circuit portion 1550, a semiconductor memory circuit portion 1552, and an antenna portion 1554 over the same substrate is described. Circuits including thin film transistors are integrated in the logic circuit portion 1550. In the semiconductor memory circuit portion 1552, a memory cell includes a plurality of PIN diodes and a plurality of anti-fuses. Note that, for convenience, two thin film transistors included in the logic circuit portion 1550, one PIN diode and one anti-fuse included in the semiconductor memory circuit portion 1552, and one capacitor and one thin film transistor included in the antenna portion 1554 are shown in cross section. Note that each element shown in the cross-sectional view in this embodiment is illustrated with an exaggerated scale in order to clearly describe the structures.

Note that in this embodiment, the semiconductor device is described as all devices which function by utilizing semiconductor characteristics.

First, a metal layer 1502 which is to be a separation layer is formed over a supporting substrate 1501. A glass substrate is used as the supporting substrate 1501. Further, as the metal layer 1502, a tungsten layer, a tungsten nitride layer, or a molybdenum layer with a thickness of 30 to 200 nm which is obtained by a sputtering method is used.

Next, a surface of the metal layer 1502 is oxidized to form a metal oxide layer. The metal oxide layer may be formed by oxidation of the surface of the metal layer 1502 with pure water or ozone water, or oxidation of the surface of the metal layer 1502 with oxygen plasma. Alternatively, the metal oxide layer may be formed by heating in an atmosphere containing oxygen. Further alternatively, the metal oxide layer may be formed in a later step of forming an insulating layer serving as a separation layer which is formed over the metal layer 1502. For example, when a silicon oxide layer or a silicon oxynitride layer is formed as the insulating layer by a plasma CVD method, the surface of the metal layer 1502 is oxidized, so that the metal oxide layer is formed. Note that the metal oxide layer is not illustrated here.

Next, a first insulating layer 1503 is formed over the metal layer 1502. An insulating layer such as a silicon oxide layer, a silicon nitride layer, or a silicon oxynitride layer is formed as the first insulating layer 1503. As an example of the first insulating layer 1503, a two-layer structure can be given in which a silicon nitride oxide layer having a thickness of 50 to 100 nm which is formed by a plasma CVD method using $SiH_4$, $NH_3$, and $N_2O$ as reactive gases, and a silicon oxynitride layer having a thickness of 100 to 150 nm which is formed by a plasma CVD method using $SiH_4$ and $N_2O$ as reactive gases are stacked. When the first insulating layer 1503 has a layered structure, as at least one layer of the first insulating layer 1503, a silicon nitride layer or a silicon oxynitride layer each having a thickness of less than or equal to 10 nm is preferably formed. Alternatively, a three-layer structure may be employed in which a silicon nitride oxide layer, a silicon oxynitride layer, and a silicon nitride layer are sequentially stacked. Although the first insulating layer 1503 serves as a base insulating layer, it is not necessarily provided if it is not particularly needed. Further, a base insulating layer such as a silicon oxide layer or a silicon nitride layer may be provided between a separation layer (here, the metal layer 1502) and the substrate.

Next, the semiconductor layer was formed over the first insulating layer 1503. The semiconductor layer is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, a crystallization method using a metal element, such as nickel, which promotes crystallization, or the like can be used. Note that when the semiconductor layer is formed by a plasma CVD method, the first insulating layer 1503 and the semiconductor layer having an amorphous structure can be successively formed without exposure to the air. The semiconductor layer is formed to a thickness of 25 to 80 nm (preferably 30 to 70 nm). Although there is no particular limitation on a material of the semiconductor layer, silicon, a silicon germanium, or the like is preferably used.

Alternatively, for crystallization treatment of the semiconductor layer having an amorphous structure, a continuous wave laser can be used. In order to obtain a crystal with a large grain size in crystallization of the semiconductor layer having an amorphous structure, it is preferable to employ second to fourth harmonics of a solid laser capable of continuous wave oscillation. As a typical example, the second harmonic (532 nm) or the third harmonic (355 nm) of an $Nd:YVO_4$ laser (fundamental wave of 1064 nm) may be applied. In the case of using the continuous wave laser, a laser beam emitted from a continuous wave $YVO_4$ laser with an output power of 10 W is converted into a harmonics by a non-linear optical element. The harmonics can also be obtained by putting a $YVO_4$ crystal and a non-linear optical element in the resonator. It is preferable to shape the laser beam into a rectangular or elliptical laser beam on an irradiation surface by an optical system and then deliver the laser beam to an object. At this time, an energy density of approximately 0.01 to 100 $MW/cm^2$ (preferably, 0.1 to 10 $MW/cm^2$) is needed. Then, the semiconductor layer may be moved at a speed of approximately 10 to 2000 cm/sec relatively to the laser beam so as to be irradiated.

Note that if necessary, a small amount of an impurity element (boron or phosphorus) is added to the semiconductor layer in order to control a threshold value of a thin film transistor to be completed later. Here, boron is added by an ion doping method in which diborane ($B_2H_6$) is excited by plasma without mass separation.

Next, a surface of the semiconductor layer is washed at the same time as removal of an oxide film on the surface of the semiconductor layer with an etchant containing hydrofluoric acid. Then, a second insulating layer which covers the semiconductor layer is formed. The second insulating layer is formed to a thickness of 1 to 200 nm by a CVD method or a sputtering method. Preferably, an insulating layer containing silicon is formed to be as thin as 10 to 50 nm to have a single layer or a layered structure, and then surface nitridation treatment is performed using plasma excited by a microwave. The second insulating layer serves as a gate insulating layer of a thin film transistor to be formed later.

Note that in order to make the semiconductor layer, which is in a region to be a capacitor later, function as a conductor, an impurity element (boron or phosphorus) is added to the semiconductor layer at a high concentration. At this time, a region except the region to be the capacitor may be covered with a resist mask. Also, a p-type impurity region, an intrinsic semiconductor region, and an n-type semiconductor region are formed using a resist mask or the like in the semiconductor layer which is to be the PIN diode.

Next, gate electrodes 1504, 1505, 1506, and 1507 and a first electrode 1509 which functions as a lower electrode of the anti-fuse are formed over the second insulating layer. A conductive layer having a thickness of 100 to 500 nm which is obtained by a sputtering method is selectively etched and processed into a desired shape, so that the gate electrodes 1504 to 1507 and the first electrode 1509 are obtained.

As a material of the gate electrodes 1504 to 1507 and the first electrode 1509, a substance such as tungsten, titanium, aluminum, nickel, chromium, molybdenum, tantalum, cobalt, zirconium, vanadium, palladium, hafnium, platinum, or iron; a single layer structure or a layered structure of a material selected from an alloy thereof or a compound thereof can be used. The material which reacts with silicon to form a silicide is preferably used. Note that a metal with a high melting point is preferably used as the gate electrode of the thin film transistor. Specifically, tungsten or molybdenum can be given. In the case where the gate electrodes 1504 to 1507 and the first electrode 1509 each have a layered structure, a material layer which serves as an upper layer may be formed using the above-described material, and a material layer which serves as a lower layer of the gate insulating layer side may be a polysilicon layer to which an impurity element such as phosphorus is added. Further, since the first electrode 1509 is used as an electrode of an anti-fuse which is in contact with amorphous silicon, the first electrode 1509 is preferably formed using a material which reacts with silicon.

Next, a resist mask is formed so as to cover the semiconductor layer in a region to be a p-channel transistor and the PIN diode, and an impurity element is introduced into the semiconductor layers in regions to be n-channel transistors, using the gate electrodes 1505, 1506, and 1507 as masks, so that low-concentration impurity regions are formed. As the impurity element, an impurity element imparting n-type conductivity or an impurity element imparting p-type conductivity can be used. As the impurity element imparting n-type conductivity, phosphorus (P), arsenic (As), or the like can be used. Here, phosphorus is introduced into the semiconductor layers in the regions to be the n-channel transistors so as to be contained at concentrations of $1\times10^{15}$ to $1\times10^{19}/cm^3$, so that n-type impurity regions are formed.

Next, the resist mask is removed. A resist mask is formed so as to cover the semiconductor layers to be the n-channel transistors and part of the PIN diode, and an impurity element is introduced into the semiconductor layer to be the p-channel transistors and regions which are to be p-type impurity regions of the PIN diode, using the gate electrode 1504 as masks, so that p-type impurity regions are formed. As the impurity element imparting p-type conductivity, boron (B), aluminum (Al), gallium (Ga), or the like can be used. Here, boron (B) is introduced into the semiconductor layer in the region to be the p-channel transistors so as to be contained at concentrations of $1\times10^{19}$ to $1\times10^{20}/cm^3$, so that the p-type impurity regions can be formed. As a result, a channel formation region 1516a and a pair of p-type impurity regions 1514a are formed in a self-aligned manner in the semiconductor layer in the region that is to be the p-channel transistor, and a p-type semiconductor region 1514b is formed in a self-aligned manner in the semiconductor layer in the region that is to be the PIN diode. The p-type impurity regions 1514a each serve as a source region or a drain region.

Next, sidewall insulating layers 1510 are formed on side surfaces of the gate electrodes 1504 to 1507 and sidewall insulating layers 1511 are formed on side surfaces of the first electrode 1509. A formation method of the sidewall insulating layers 1510 and 1511 is as follows: first, a third insulating layer is formed to have a single-layer structure or a layered structure of a layer containing silicon, an oxide of silicon, or a nitride of silicon, or a layer containing an organic material such as an organic resin by a plasma CVD method, a sputtering method, or the like so as to cover the second insulating layer, the gate electrodes 1504 to 1507, and the first electrode 1509. Then, the third insulating layer is selectively etched by anisotropic etching mainly in a perpendicular direction to form insulating layers (the sidewall insulating layers 1510 and 1511) which are in contact with the side surfaces of the gate electrodes 1504 to 1507 and the first electrode 1509, respectively. Note that part of the second insulating layer is removed by being etched at the same time as the formation of the sidewall insulating layers 1510. The part of the second insulating layer is removed, so that a gate insulating layer 1512 is formed under each of the gate electrodes 1504 to 1507 and the sidewall insulating layers 1510. In addition, the part of the second insulating layer is removed, so that an insulating layer 1513 remains under the first electrode 1509 and the sidewall insulating layers 1511.

Next, a resist mask is formed so as to cover the semiconductor layer that is to be the p-channel transistor and part of the PIN diode, and an impurity element is introduced into the semiconductor layers in the regions to be the n-channel transistors, using the gate electrodes 1505, 1506, and 1507 and the sidewall insulating layers 1510 as masks, so that high-concentration impurity regions are formed. The resist mask is removed after the impurity element is introduced. Here, phosphorus (P) is introduced into the semiconductor layers in the regions to be the n-channel transistors and the semiconductor layers in the regions to be the PIN diode so as to be contained at concentrations of $1\times10^{19}$ to $1\times10^{20}/cm^3$, so that n-type high-concentration impurity regions and n-type impurity regions can be formed. As a result, in the semiconductor layers in the regions to be the n-channel transistors, a channel formation region 1521a or a channel formation region 1521c; a pair of low-concentration impurity regions 1519a or a pair of low-concentration impurity regions 1519c which functions as an LDD region; and a pair of high-concentration impurity regions 1517a or a pair of high-concentration impurity region 1517c which functions as a source region or a drain region are formed in a self-aligned manner. At the same time, a first impurity region 1521b, second impurity regions 1519b, and third impurity regions 1517b are formed in a self-aligned manner in the semiconductor layer in a region to be a capacitor. At the same time, an n-type impurity region 1515a and an intrinsic semiconductor region 1516b are formed in the semiconductor layer which is to be the PIN diode. The first impurity region 1521b is formed in a region which overlaps with the gate electrode 1506 with the gate insulating layer interposed therebetween. Note that an impurity element is selectively added at high concentration to the first impurity region 1521b before formation of the gate electrode 1506. Accordingly, the impurity concentration of the first impurity region 1521b is higher than those of the channel formation regions 1521a and 1521c. Note that the low concentration impurity regions 1519a and 1519c which serve as LDD regions and the second impurity regions 1519b are formed under the sidewall insulating layers 1510.

Note that the structure is described in which the LDD regions are formed in the semiconductor layer included in the n-channel thin film transistor and the LDD regions are not formed in the semiconductor layer included in the p-channel thin film transistor; however, the present invention is not limited thereto. The LDD regions may be formed in the semiconductor layers included in both the n-channel thin film transistor and the p-channel thin film transistor.

Next, after formation of a fourth insulating layer 1522 including hydrogen by a sputtering method, an LPCVD method, a plasma CVD method, or the like, activation treatment and hydrogenation treatment of the impurity element added into the semiconductor layer are performed. Heat treatment (at a temperature of 300 to 550° C. for 1 to 12 hours) in a furnace or an RTA method using a lamp light source is used for the activation treatment and hydrogenation treatment of the impurity element. For example, a silicon nitride oxide layer which is obtained by a plasma CVD method is used for the fourth insulating layer 1522 containing hydrogen. Here, the thickness of the fourth insulating layer 1522 containing hydrogen is set to be 50 to 200 nm. Besides, in the case where the semiconductor layer is crystallized using a metal element which promotes crystallization, typically nickel, gettering which reduces nickel in the channel formation region can also be performed at the same time as the activation. Note that the fourth insulating layer 1522 containing hydrogen is a first layer of an interlayer insulating layer.

Then, a fifth insulating layer 1523 is formed as a second layer of the interlayer insulating layer by a sputtering method, an LPCVD method, a plasma CVD method, or the like. An insulating layer in a single layer or stacked layers such as a silicon oxide layer, a silicon nitride layer, or a silicon oxynitride layer is used as the fifth insulating layer 1523. Here, the thickness of the fifth insulating layer 1523 is 300 to 800 nm.

Next, a resist mask is formed over the fifth insulating layer 1523 and the fourth insulating layer 1522 and the fifth insulating layer 1523 are selectively etched, so that a first opening 1520 reaching the first electrode 1509 is formed. The resist mask is removed after the etching. The diameter of the first opening is preferably about 1 to 6 μm. In this embodiment, the diameter of the first opening 1520 is 2 μm.

A cross-sectional view of the semiconductor device which is obtained through the steps up to here corresponds to FIG. 15A.

Next, a silicon oxynitride layer and an amorphous silicon layer are stacked using a sputtering method, an LPCVD method, a plasma CVD method, or the like. In this embodiment, an amorphous silicon layer with a thickness of 15 nm and a silicon oxynitride layer with a thickness of 6 nm are stacked in this order by a plasma CVD. Then, a resist mask is formed and the amorphous silicon layer and the silicon oxynitride layer are selectively etched, so that an amorphous silicon layer 1524a and a silicon oxynitride layer 1524b which overlap with the first opening 1520 are formed. The amorphous silicon layer 1524a and the silicon oxynitride layer 1524b are to be resistance material layers of anti-fuse elements. The resist mask is removed after the etching.

A cross sectional view of the semiconductor device which is obtained through the steps up to here corresponds to FIG. 15B.

Next, a resist mask is formed and the fourth insulating layer 1522 and the fifth insulating layer 1523 are selectively etched, so that contact holes which reach the semiconductor layers, contact holes which reach the gate electrodes, and a second opening which reaches the first electrode 1509 are formed. The resist mask is removed after the etching.

A cross-sectional view of the semiconductor device manufactured through the preceding steps corresponds to FIG. 15C.

Next, oxide films formed on exposed surfaces of the semiconductor layers and on an exposed surface of the first electrode 1509 are removed with an etchant containing hydrofluoric acid, and at the same time, the exposed surfaces of the semiconductor layers and the exposed surface of the first electrode 1509 are washed.

Next, a conductive layer is formed by a sputtering method to form an upper electrode of the anti-fuse, an electrode of the PIN diode, the source and drain electrodes and the like of the thin film transistors, and the like. This conductive layer is formed in a single layer or stacked layers of a substance such as tungsten, titanium, aluminum, nickel, chromium, molybdenum, tantalum, cobalt, zirconium, vanadium, palladium, hafnium, platinum, or iron, or an alloy or a compound thereof. However, this conductive layer is also used for the source and drain electrodes of the thin film transistors. Therefore, it is preferable to use a material which has relatively low contact resistance with the semiconductor layer of the thin film transistor. For example, a three-layer structure of a titanium layer, an aluminum layer containing a minute amount of silicon, and a titanium layer or a three-layer structure of a titanium layer, an aluminum alloy layer containing nickel and carbon, and a titanium layer is employed. In this embodiment, a three-layer structure of a 100 nm thick titanium layer, a 350 nm thick pure aluminum layer, and a 100 nm thick titanium layer is employed. Further, this embodiment shows the example in which a tungsten layer is used as a material of the lower electrode of the anti-fuse and a titanium layer is used as a material of the upper electrode. However, the materials are not particularly limited as long as they can change the state of the resistance material layer from a high resistance state to a low resistance state and the same material may be used for the upper electrode and the lower electrode of the anti-fuse. When the lower electrode and the upper electrode of the anti-fuse are formed using the same material, they are formed to have a single layer structure or a layered structure of a material which is selected from a substance such as tungsten, titanium, aluminum, nickel, chromium, molybdenum, tantalum, cobalt, zirconium, vanadium, palladium, hafnium, platinum, or iron, an alloy material or a compound material thereof.

Next, a resist mask is formed, and the conductive layer is selectively etched, so that conductive layers 1525, 1526, 1527, 1528, 1531, 1532, 1533, and 1534 which function as source or drain electrodes, wirings 1529 and 1530 which function as electrodes of the PIN diode, wirings 1535, 1536, 1537, 1538, and 1539 which function as gate lead wirings, a second electrode 1540 and a third electrode 1541 of a semiconductor memory circuit portion, and a fourth electrode 1542 of an antenna portion are formed. The second electrode 1540 overlaps with the first opening 1520 to serve as the upper electrode of the anti-fuse. In addition, the third electrode 1541 overlaps with the second opening to be electrically connected to the first electrode 1509. Note that the fourth electrode 1542 is electrically connected to thin film transistors of the antenna portion though the connection is not illustrated here. The resist mask is removed after the etching.

A cross-sectional view of the semiconductor device manufactured through the preceding steps corresponds to FIG. 15D. In this embodiment, a thin film transistor in the logic circuit portion 1550, a PIN diode 1559 and an anti-fuse 1560 in the semiconductor memory circuit portion 1552, and a thin film transistor in the antenna portion 1554 are formed over the same substrate. Here, a cross-sectional view of a p-channel transistor and an n-channel transistor which are provided in the logic circuit portion 1550, a PIN diode 1559 and the anti-fuse 1560 which are provided in the semiconductor memory circuit portion 1552, and a capacitor and an n-channel transistor which are provided in the antenna portion is shown. Note that one embodiment of the present invention is not limited thereto and the thin film transistor provided in the semiconductor memory circuit portion 1552 may be a p-channel transistor. Further, a p-channel transistor may be provided in the antenna portion 1554. Here, one n-channel transistor is illustrated for convenience.

Next, a sixth insulating layer 1543 is formed to cover the thin film transistor in the logic circuit portion 1550, the PIN diode and the anti-fuse element in the semiconductor memory circuit portion 1552, and the thin film transistor in the antenna portion 1554. An insulating layer containing silicon oxide or an insulating layer formed using an organic resin can be used as the sixth insulating layer 1543. The insulating layer containing silicon oxide is preferably used to improve reliability of a semiconductor device. Alternatively, an insulating layer containing an organic resin formed by a coating method is preferably used because the sixth insulating layer 1543 preferably has a planar surface in the case where an antenna to be formed later is formed by a screen printing method. The material for forming the sixth insulating layer 1543 may be selected by a practitioner as appropriate. Further, the antenna to be formed later may be formed so as to reach a region which overlaps with the logic circuit portion 1550 and the semiconductor memory circuit portion 1552. In this case, the sixth insulating layer 1543 also functions as an interlayer insulating layer which isolates the element of the logic circuit portion 1550 and the element of the semiconductor memory circuit portion 1552 from the antenna. In the case where the antenna has a circular shape (for example, a loop antenna) or a spiral shape, one of both ends of the antenna is led by a wiring of a lower layer; thus, it is preferable to provide the sixth insulating layer 1543. However, in the case where a microwave method is employed and the antenna has a linear shape (for example, a dipole antenna), a flat shape (for example, a patch antenna), or the like, the antenna to be formed later can be arranged so as not to overlap with the logic circuit portion and the semiconductor memory circuit portion; thus, the sixth insulating layer 1543 is not necessarily provided.

Next, a resist mask is formed, and the sixth insulating layer 1543 is selectively etched, so that a third opening reaching the third electrode 1541 and a fourth opening reaching the fourth electrode 1542 are formed. The resist mask is removed after the etching.

Figure 16A:
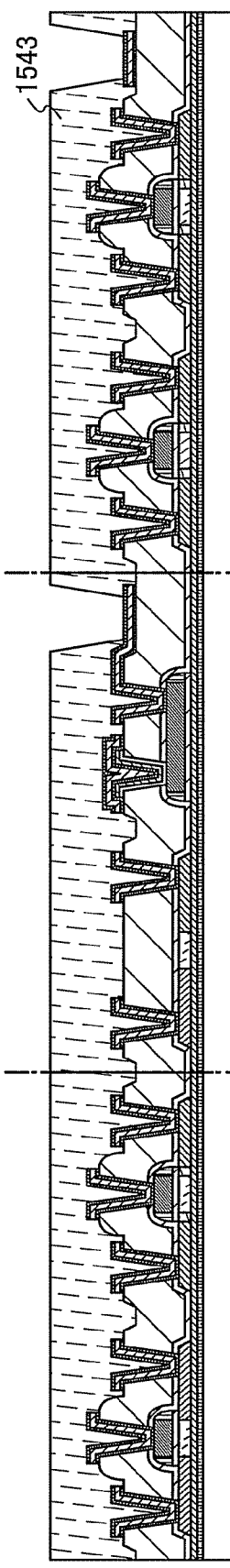
FIGS. 16A to 16C are diagrams for describing Embodiment 6.

FIG. 16A is a cross-sectional view of the semiconductor device which has undergone the steps up to here.

Next, a metal layer is formed over the sixth insulating layer 1543. As the metal layer, a single layer or a stack layer selected from Ti, Ni and Au can be used. Then, a resist mask is formed, and the metal layer is selectively etched, so that a lead wiring 1544 is formed in a lead wiring portion 1562 of the first electrode 1509 and a base layer 1545 of the antenna is formed. Note that the lead wiring 1544 and the base layer 1545 here can be selectively formed by a sputtering method using a metal mask without using the resist mask, as well. When the base layer 1545 of the antenna is provided, a large contact area with the antenna can be secured. In addition, the lead wiring 1544 is not necessarily formed depending on a layout of a circuit design.

Figure 16B:
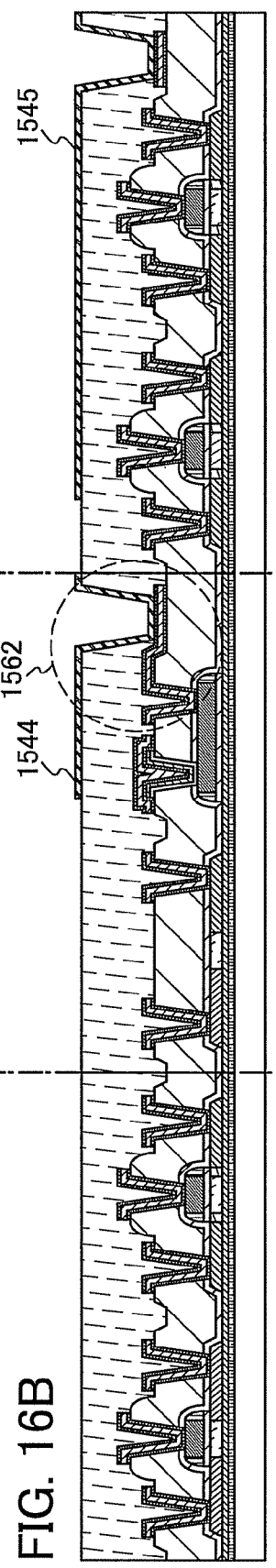

FIG. 16B is a cross-sectional view of the semiconductor device which has undergone the steps up to here.

Next, an antenna 1546 is formed over the base layer 1545 of the antenna. The antenna 1546 can be formed by such a method in which a metal layer of Al, Ag, or the like is formed by a sputtering method and then is selectively etched into a desired shape. Alternatively, the antenna 1546 can be formed by a screen printing method. A screen printing method refers to a method in which an ink or a paste, which is provided on a screen plate formed in such a manner that a predetermined pattern is formed by a photosensitive resin on a base made of a metal mesh or a high molecular compound fiber mesh, is transferred to a work which is placed on the opposite side of the screen plate, with the use of a rubber, plastic, or metal blade which is called a squeegee. A screen printing method has a merit that pattern formation in a comparatively large area is realized at low cost.

Figure 16C:
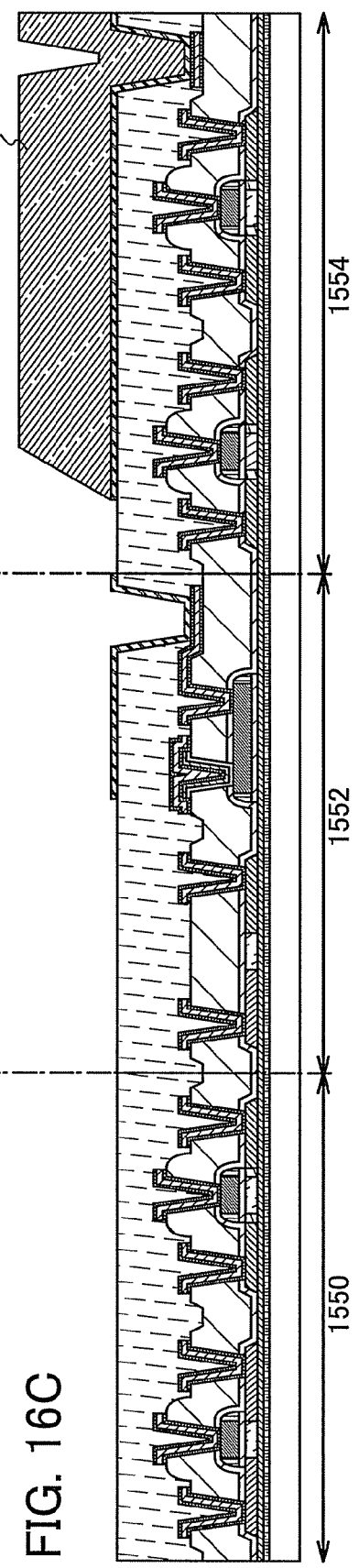

FIG. 16C is a cross-sectional view of the semiconductor device which has undergone the steps up to here. In this embodiment, the thin film transistor in the logic circuit portion 1550, the PIN diode 1559 and the anti-fuse in the semiconductor memory circuit portion 1552, and the thin film transistor and the antenna in the antenna portion 1554 are formed over the same substrate.

Next, the metal layer 1502 and the supporting substrate 1501 are removed by separation. Separation can occur inside the metal oxide layer, at an interface between the first insulating layer 1503 and the metal oxide layer, or an interface between the metal oxide layer and the metal layer 1502, so that a portion which is over the first insulating layer 1503 to be the semiconductor device can be separated from the substrate 1501 with relatively less force. When the metal layer 1502 and the supporting substrate 1501 are removed, a fixing substrate may be attached to the side where the antenna is provided.

Next, one sheet over which a plurality of semiconductor devices is formed is divided into individual semiconductor devices by a cutter, dicing, or the like. In addition, with the use of a method in which each semiconductor device is picked up and separated, this dividing step is not needed.

Then, the semiconductor devices are fixed to a sheet-like base. For the sheet-like substrate, plastic, paper, a prepreg, a ceramic sheet, or the like can be used. The semiconductor device may be fixed so as to be interposed between two sheet-like substrates, or the semiconductor device may be fixed to one sheet-like substrate with an adhesive layer. For the adhesive layer, various curable adhesives such as a photo curable adhesive such as a reactive curable adhesive, a thermosetting adhesive, or an ultraviolet cure adhesive; or an aerobic adhesive can be used. Alternatively, the semiconductor device is provided in the middle of the formation of paper so that the semiconductor device can be provided inside one sheet of paper.

A memory of the semiconductor device which has undergone the above-described steps includes the semiconductor memory device according to one embodiment of the present invention. With the semiconductor device provided with the semiconductor memory device according to one embodiment of the present invention, the number of wirings can be reduced and miniaturization can be achieved. Further, malfunction in data writing or data reading can be reduced.

Note that this embodiment can be combined with any of other embodiments as appropriate.

Embodiment 7

In this embodiment, one example of usage form of the semiconductor device provided with the semiconductor memory device according to one embodiment of the present invention, which are described in Embodiments 5 and 6, will be shown.

Figure 17A:
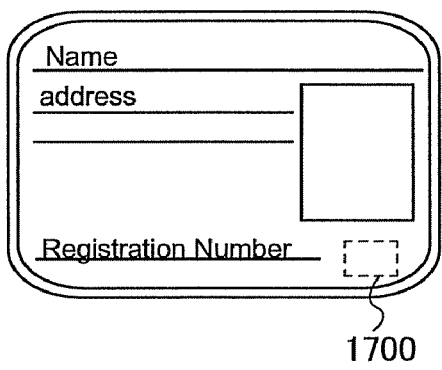
FIGS. 17A to 17F are diagrams for describing Embodiment 7.
Figure 17B:
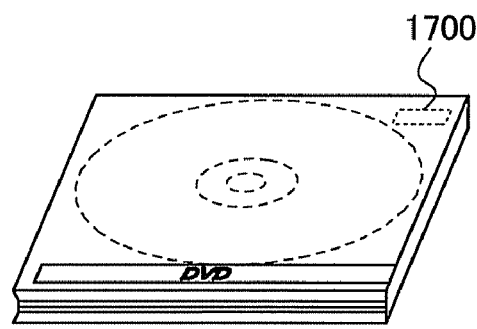
Figure 17C:
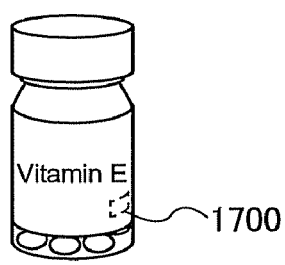
Figure 17D:
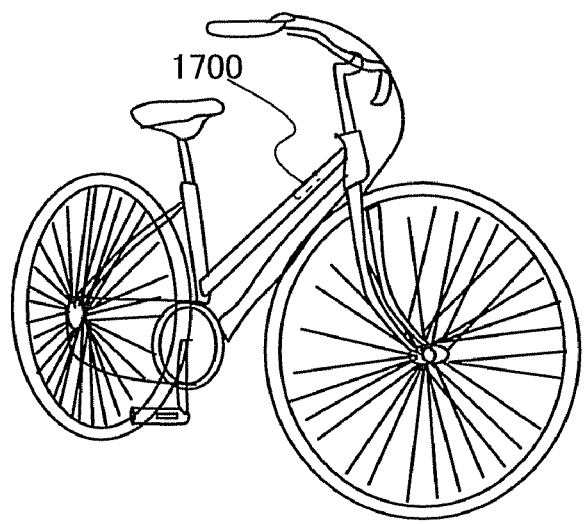
Figure 17E:
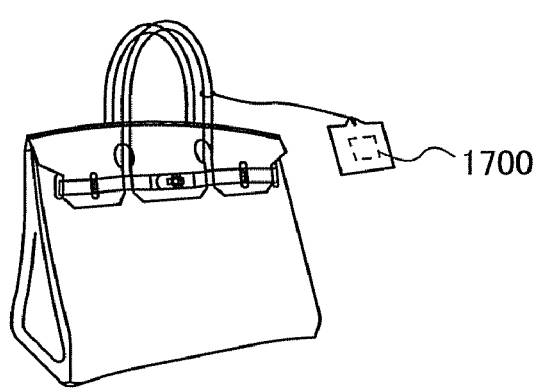
Figure 17F:
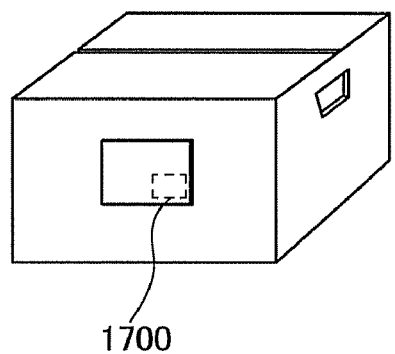

As illustrated in FIGS. 17A to 17F, the semiconductor device can be used widely and can be used by being provided for, for example, bills, coins, securities, bearer bonds, certificates (e.g., driver's licenses or resident cards, see FIG. 17A), or objects such as containers for wrapping (e.g., wrapping paper or bottles, see FIG. 17C), recording media (e.g., DVDs or video tapes, see FIG. 17B), vehicles (e.g., bicycles, see FIG. 17D), personal belongings (e.g., bags or glasses), foods, plants, animals, clothes, livingwares, or electronic devices (e.g., liquid crystal display devices, EL display devices, television sets, or mobile phones), or shipping tags of the objects (see FIGS. 17E and 17F).

A semiconductor device 1700 according to one embodiment of the present invention is fixed on products by, for example, being mounted on a printed wiring board, being attached to a surface thereof, or being embedded therein. For example, the semiconductor device is incorporated in paper of a book or an organic resin of a package to be fixed in each object. As for the semiconductor device 1700 according to one embodiment of the present invention, a small size, a thin shape, and lightweight are achieved and an attractive design of the object itself is not damaged even after being fixed in the object. Further, bills, coins, securities, bearer bonds, documents, or the like can have identification functions by being provided with the semiconductor device 1700 according to one embodiment of the present invention, and the identification functions can be utilized to prevent counterfeits. Further, when the semiconductor device according to one embodiment of the present invention is attached to containers for wrapping, recording media, personal belongings, foods, clothes, livingwares, electronic devices, or the like, a system such as an inspection system can be efficiently used. Even vehicles can have higher security against theft or the like by being provided with the semiconductor devices according to one embodiment of the present invention.

When a semiconductor device provided with the semiconductor memory device according to one embodiment of the present invention is used for each usage described in this embodiment in this manner, data which is used for exchanging information can be maintained at an accurate value. Therefore, authenticity of the articles or reliability of security can be increased.

Note that this embodiment mode can be combined with any of the other embodiments as appropriate.

This application is based on Japanese Patent Application serial no. 2008-227769 filed with Japan Patent Office on Sep. 5, 2008, the entire contents of which are hereby incorporated by reference.

EXPLANATION OF REFERENCE

100: Semiconductor memory device, 101: Bit line driver circuit, 102: Word line driver circuit, 103: Memory cell array, 104: PIN diode, 105: Anti-fuse, 106: Memory cell, 200: Semiconductor memory device, 201: Interface portion, 202: Boosting circuit, 301: Arrow, 302: Arrow, 303: Arrow, 351: Switch, 401: Arrow, 501: Period, 502: Period, 503: Period, 504: Period, 600: Semiconductor memory device, 601: Bit line driver circuit, 602: Word line driver circuit, 603: Memory cell array, 604: Thin film transistor, 605: Anti-fuse, 606: Memory cell, 700: Anti-fuse, 702: Electrode, 704: Low Resistance material layer, 706: Insulating layer, 708: Silicon layer, 710: Electrode, 800: Supporting substrate, 801: Blocking film, 802: Semiconductor layer, 803: Insulating layer, 804: Conductive layer, 805: First interlayer film, 807: Silicon layer, 808: Insulating layer, 809: P-type semiconductor region, 810: Intrinsic semiconductor region, 811: N-type semiconductor region, 901: Interlayer film, 1000: Supporting substrate, 1001: Blocking film, 1002: Conductive layer, 1003: P-type semiconductor layer, 1004: Intrinsic semiconductor layer, 1005: N-type semiconductor layer, 1006: Conductive layer, 1007: Insulating layer, 1008: Silicon layer, 1009: First interlayer film, 1010: Conductive layer, 1101: Interlayer film, 1400: Semiconductor device, 1401: Reader/writer, 1402: Antenna, 1403: Radio signal, 1404: Antenna, 1405: Rectifier circuit, 1406: Constant voltage circuit, 1407: Demodulation circuit, 1408: Modulation circuit, 1409: Logic circuit, 1410: Semiconductor memory device, 1411: ROM, 1501: Supporting substrate, 1502: Metal layer, 1503: Insulating layer, 1504: Gate electrode, 1505: Gate electrode, 1506: Gate electrode, 1507: Gate electrode, 1509: Electrode, 1510: Side wall insulating layer, 1511: Side wall insulating layer, 1512: Gate insulating layer, 1513: Insulating layer, 1520: Opening, 1522: Insulating layer, 1523: Insulating layer, 1525: Conductive layer, 1526: Conductive layer, 1527: Conductive layer, 1528: Conductive layer, 1529: Wiring, 1530: Wiring, 1531: Conductive layer, 1532: Conductive layer, 1533: Conductive layer, 1534: Conductive layer, 1535: Wiring, 1536: Wiring, 1537: Wiring, 1538: Wiring, 1539: Wiring, 1540: Electrode, 1541: Electrode, 1542: Electrode, 1543: Insulating layer, 1544: Lead wiring, 1545: Base layer, 1546: Antenna, 1550: Logic circuit portion, 1552: Semiconductor memory circuit portion, 1554: Antenna portion, 1559: PIN diode, 1560: Anti-fuse, 1562: Lead wiring portion, 1700: Semiconductor device, 806A: Conductive layer, 806B: Conductive layer, 1514*a*: P-type impurity region, 1514*b*: P-type semiconductor region, 1515*a*: N-type impurity region, 1516*a*: Channel formation region, 1516*b*: Intrinsic semiconductor region, 1517*a*: High-concentration impurity region, 1517*b*: Impurity region, 1517*c*: High-concentration impurity region, 1519*a*: Low-concentration impurity region, 1519*b*: Impurity region, 1519*c*: Low-concentration impurity region, 1521*a*: Channel formation region, 1521*b*: Impurity region, 1521*c*: Channel formation region, 1524*a*: Amorphous silicon layer, 1524*b*: Silicon oxynitride layer

The invention claimed is:

1. A semiconductor memory device comprising:
   a plurality of word lines;
   a plurality of bit lines intersecting the plurality of word lines; and
   a plurality of memory cells arranged in matrix, provided at intersecting portions of the plurality of word lines and the plurality of bit lines,
   wherein each of the plurality of memory cells includes a PIN diode and an anti-fuse,
   wherein an anode of the PIN diode is electrically connected to one of the plurality of bit lines,
   wherein a cathode of the PIN diode is electrically connected to a first terminal of the anti-fuse,
   wherein a second terminal of the anti-fuse is electrically connected to one of the plurality of word lines,
   wherein the anti-fuse includes a silicon layer and an insulating layer which are interposed between a pair of electrodes,
   wherein a current direction in the PIN diode is parallel to a surface of a substrate.

2. The semiconductor memory device according to claim 1,
   wherein the first terminal of the anti-fuse is connected to the insulating layer, and
   wherein the second terminal of the anti-fuse is connected to the silicon layer.

3. The semiconductor memory device according to claim 1, wherein the insulating layer is any one of silicon oxide, silicon nitride, silicon oxynitride and silicon nitride oxide.

4. The semiconductor memory device according to claim 1, wherein the silicon layer includes any one of an amorphous silicon, a microcrystalline silicon and a polycrystalline silicon.

5. A semiconductor memory device comprising:
   a plurality of word lines;
   a plurality of bit lines intersecting the plurality of word lines; and
   a plurality of memory cells arranged in matrix, provided at intersecting portions of the plurality of word lines and the plurality of bit lines,
   wherein each of the plurality of memory cells includes a PIN diode and an anti-fuse,
   wherein a first terminal of the anti-fuse is electrically connected to one of the plurality of bit lines,
   wherein a second terminal of the anti-fuse is electrically connected to an anode of the PIN diode,
   wherein a cathode of the PIN diode is electrically connected to one of the plurality of word lines,
   wherein the anti-fuse includes a silicon layer and an insulating layer which are interposed between a pair of electrodes, and
   wherein a current direction in the PIN diode is parallel to a surface of a substrate.

6. The semiconductor memory device according to claim 5,
   wherein the first terminal of the anti-fuse is connected to the insulating layer, and
   wherein the second terminal of the anti-fuse is connected to the silicon layer.

7. The semiconductor memory device according to claim 5, wherein the insulating layer is any one of silicon oxide, silicon nitride, silicon oxynitride and silicon nitride oxide.

8. The semiconductor memory device according to claim 5, wherein the silicon layer includes any one of an amorphous silicon, a microcrystalline silicon and a polycrystalline silicon.

9. A semiconductor memory device comprising:
   a plurality of word lines over a substrate;
   a plurality of bit lines intersecting the plurality of word lines over the substrate; and
   a plurality of memory cells arranged in matrix, provided at intersecting portions of the plurality of word lines and the plurality of bit lines,
   wherein each of the plurality of memory cells includes a PIN diode and an anti-fuse,
   wherein an anode of the PIN diode is electrically connected to one of the plurality of bit lines,
   wherein a cathode of the PIN diode is electrically connected to a first terminal of the anti-fuse,
   wherein a second terminal of the anti-fuse is electrically connected to one of the plurality of word lines,
   wherein the anti-fuse includes a silicon layer and an insulating layer which are interposed between a pair of electrodes, and
   wherein a current direction in the PIN diode is parallel to a surface of the substrate.

10. The semiconductor memory device according to claim 9,
    wherein the first terminal of the anti-fuse is connected to the insulating layer, and
    wherein the second terminal of the anti-fuse is connected to the silicon layer.

11. The semiconductor memory device according to claim 9, wherein the insulating layer is any one of silicon oxide, silicon nitride, silicon oxynitride and silicon nitride oxide.

12. The semiconductor memory device according to claim 9, wherein the silicon layer includes any one of an amorphous silicon, a microcrystalline silicon and a polycrystalline silicon.

* * * * *